United States Patent [19]

Deveres et al.

[11] 4,177,554
[45] Dec. 11, 1979

[54] ASSEMBLING LEADS TO A SUBSTRATE

[75] Inventors: Ernest E. Deveres, Lowell; Paul J. Ouellette, Amesbury; Joseph F. Pollitt, Bradford, all of Mass.

[73] Assignee: Western Electric Co., Inc., New York, N.Y.

[21] Appl. No.: 900,220

[22] Filed: Apr. 26, 1978

[51] Int. Cl.² ............................................. H05K 3/32
[52] U.S. Cl. ...................................... 29/626; 29/741; 29/564.6; 29/566.2
[58] Field of Search ...................... 29/739, 759, 564.6, 29/564.8, 626, 741, 576 S, 630 B, 566.2; 227/96, 95, 97, 90; 339/17 R

[56] References Cited

U.S. PATENT DOCUMENTS

| | | |
|---|---|---|
| 3,374,537 | 3/1968 | Doelp, Jr. |
| 3,465,409 | 9/1969 | Brosseit |
| 3,497,938 | 3/1970 | Wright ................................ 29/630 B |
| 3,689,684 | 9/1972 | Cox, Jr. et al. ................ 339/17 R X |
| 3,863,320 | 2/1975 | DeLisle ............................. 29/739 X |
| 3,887,982 | 6/1975 | DeLisle .............................. 29/564.6 |
| 4,003,125 | 1/1977 | Wallick |
| 4,015,322 | 4/1977 | Cabaud ................................. 29/739 |
| 4,019,803 | 4/1977 | Schell |
| 4,054,238 | 10/1977 | Lloyd et al. |

FOREIGN PATENT DOCUMENTS

| | | | |
|---|---|---|---|
| 1467190 | 1/1967 | France ................................ 339/17 LC |
| 1778395 | 1/1970 | United Kingdom ............. 174/DIG. 3 |

*Primary Examiner*—Francis S. Husar
*Assistant Examiner*—C. J. Arbes
*Attorney, Agent, or Firm*—D. D. Bosben

[57] ABSTRACT

Solderable leads (22) of the type which project in parallel relationship from a continuous independent support rail (30) are rapidly and efficiently assembled to substrates (26) by simultaneously feeding a pair of the independent support rails (30) and their associated leads (22) to locate successive leading sets of leads (22) on opposite sides of a lead-substrate assembling position (36). In the assembling position outer portions of the leading sets of leads (22) are engaged to move the leads (22) in opposite directions toward a substrate (26), so as to cut the support rails (30) and thus sever the leading sets of leads (22) from the remaining leads (22) on the support rails (30). Continued movement of the severed sets of leads (22) then causes the leads (22) to be assembled to respective opposite sides of the substrate (26) simultaneously. During the cutting and assembling operations inner portions of the leading sets of leads (22) are engaged to retain the leads (22) in alignment with respective terminals (24) on the substrate (26).

19 Claims, 21 Drawing Figures

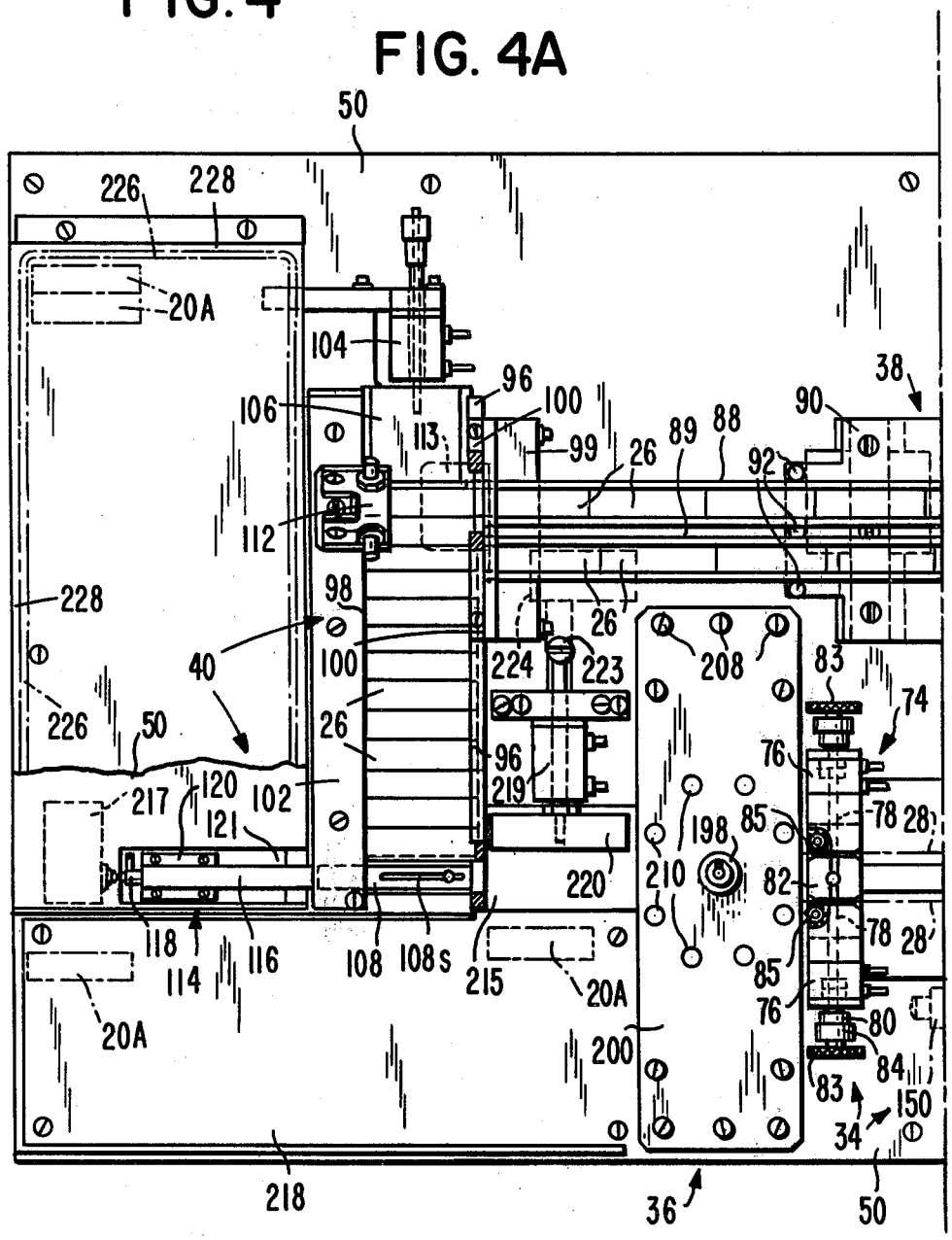

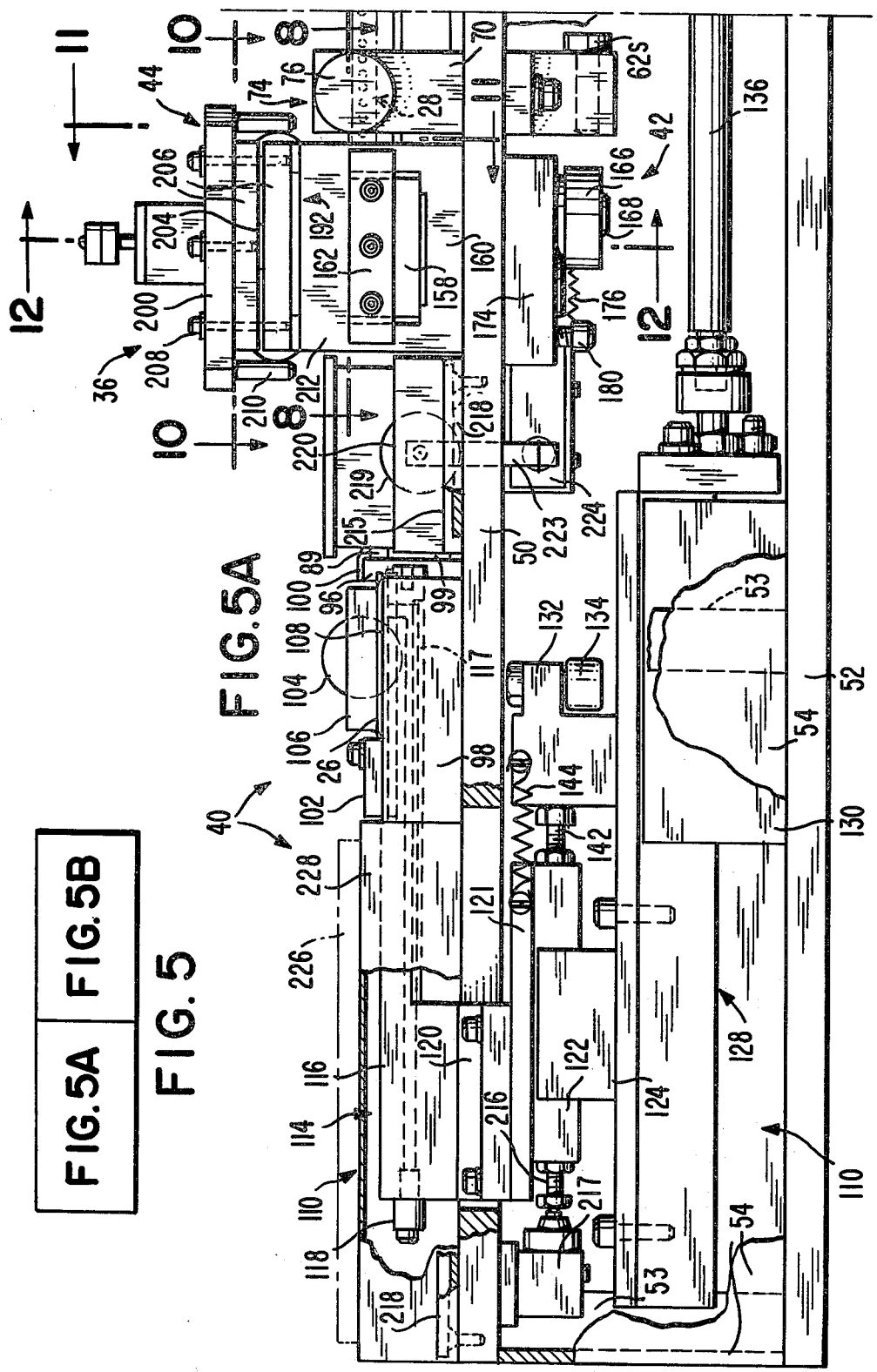

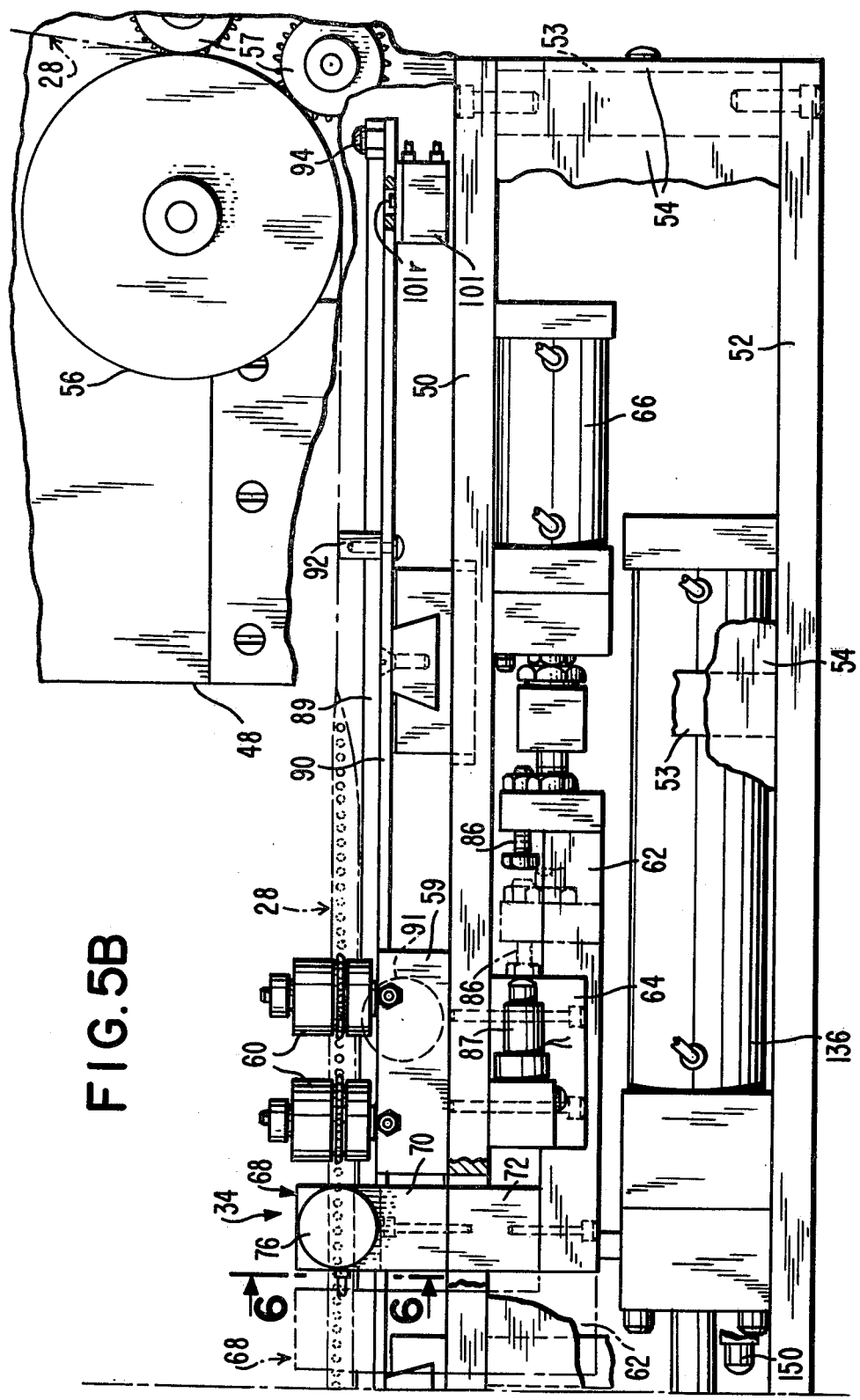

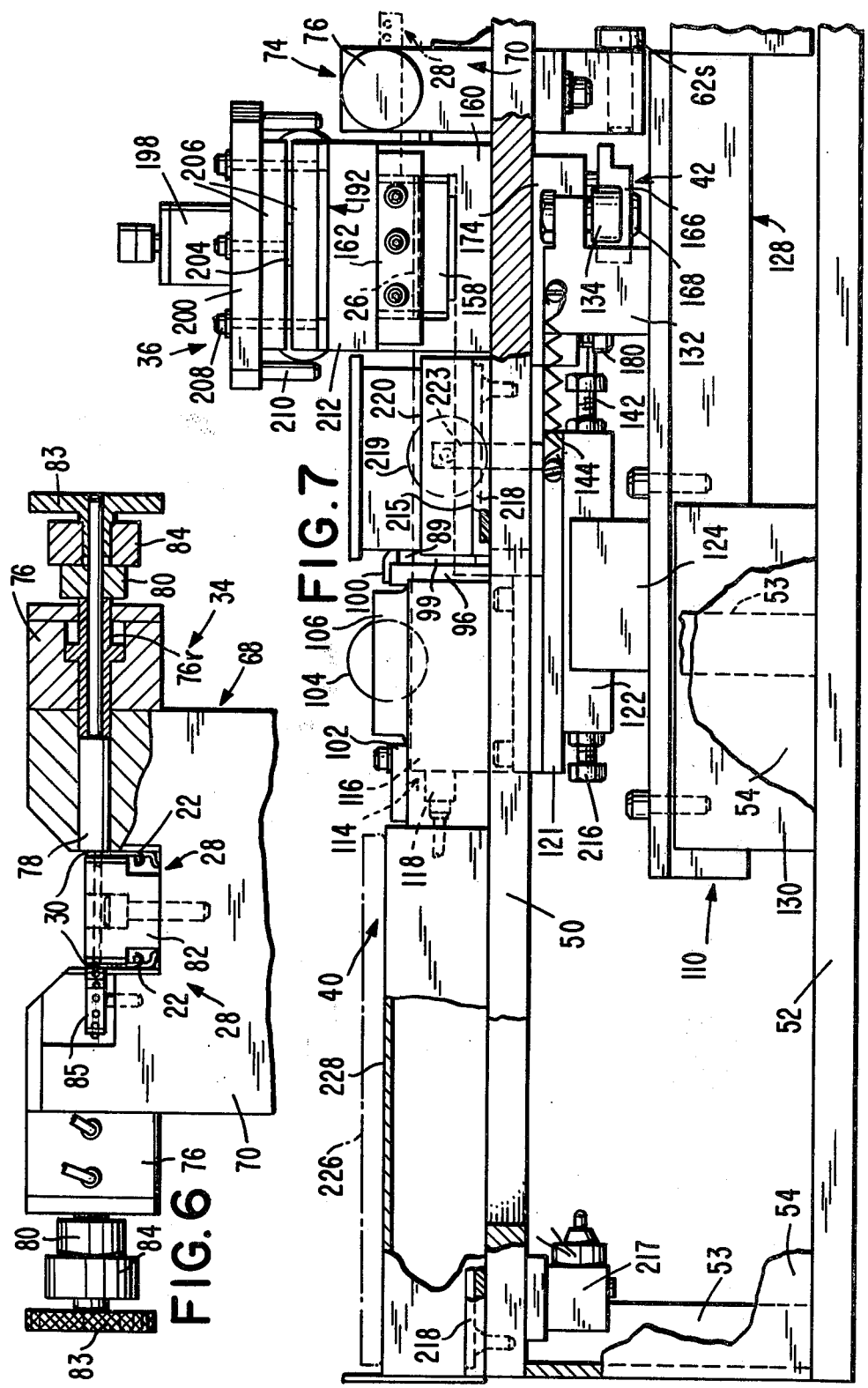

FIG. 16

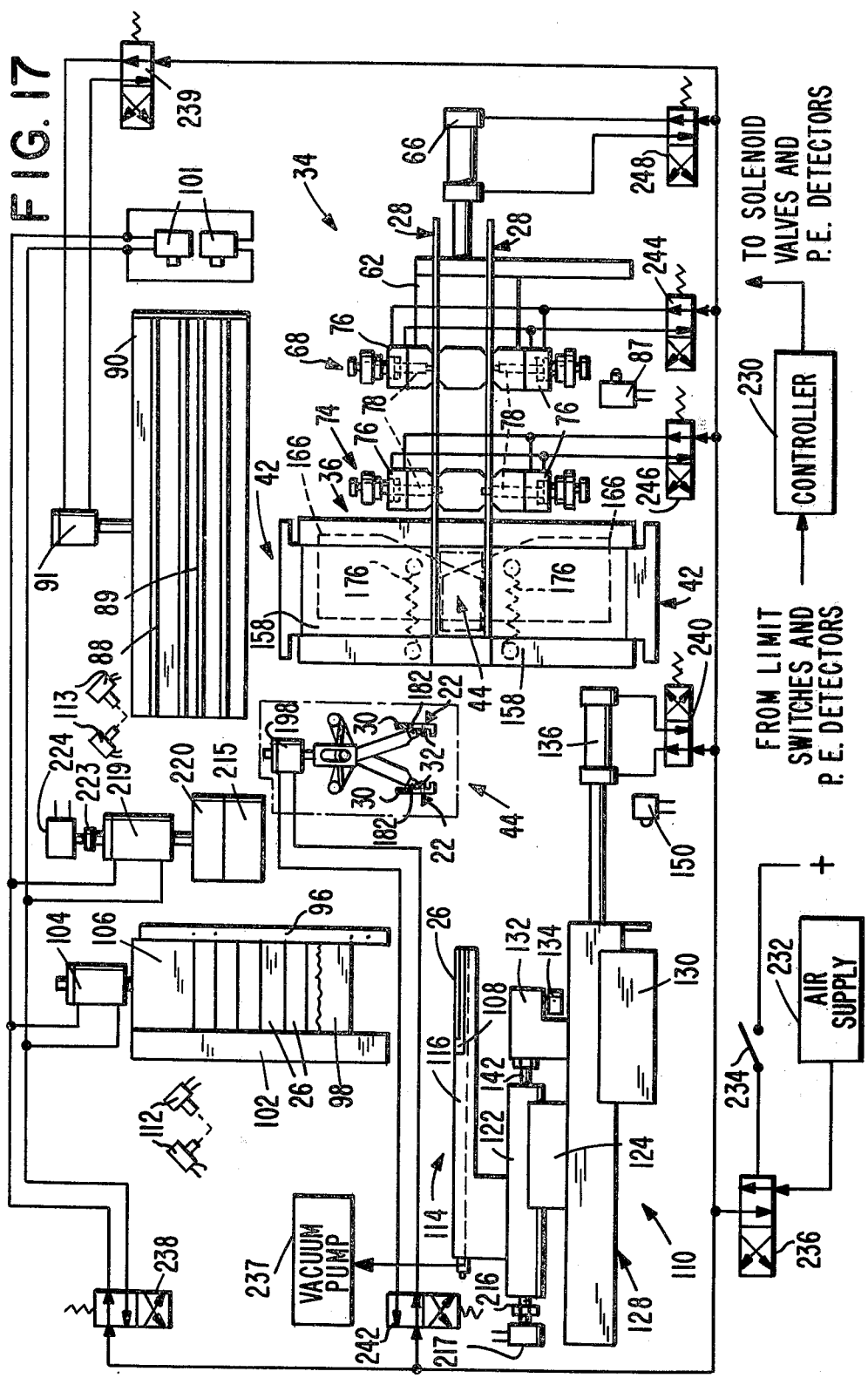

ASSEMBLING LEADS TO A SUBSTRATE

FIELD OF THE INVENTION

This invention relates to a method of and apparatus for assembling leads to a substrate, and more specifically to a method of and apparatus for assembling leads to substrates from continuous supplies of the leads.

Description of the Prior Art

The H. E. Lloyd et al. U.S. Pat. No. 4,054,238 discloses the attaching of gold plated leads of lead frames to terminals of ceramic substrates in which a continuous strip of the lead frames includes a pair of spaced elongated parallel side rails integrally interconnected by spaced transversely extending members at opposite ends of each lead frame in the strip. In addition, first and second sets of leads of each lead frame in the strip are integrally connected to respective ones of the side rails and project inwardly from the side rails to provide inner free end portions which are bonded to the terminals of a substrate. Each lead frame also is formed with opposed pairs of integral and subsequently removable aligning tabs for locating a substrate on the lead frame such that the leads of the lead frame and their respective terminals on the substrate are in alignment.

In using the continuous lead frame strip of the H. E. Lloyd et al. patent, a substrate is placed between the aligning tabs of each lead frame in an inverted position with the terminals on the substrate resting on inner free end portions of the lead frame leads. The leads of the lead frame then support the substrate for movement through a series of processing stations, including a lead-terminal thermocompression bonding station and a tab-removing station, as the continuous lead frame strip is indexed in successive steps from a continuous lead frame supply. Continuous lead frame strips in which the leads of each lead frame are bonded to terminals of a substrate by soldering also are disclosed in the W. L. Doelp, Jr. U.S. Pat. No. 3,374,537 (reflow soldering utilizing solder on the substrate) and the C. W. Wallick U.S. Pat. No. 4,003,125 (wave soldering).

An alternative to the continuous lead frame strip having gold plated leads as disclosed in the above-mentioned H. E. Lloyd et al. patent, is a continuous lead strip of a type disclosed in the M. S. Schell U.S. Pat. No. 4,019,803. In this lead strip a plurality of leads project in parallel relationship from a continuous elongated single independent support rail. Each lead has opposed spring clamping fingers at an outer end thereof for receiving a substrate therebetween. In addition, at least one spring finger of each lead has a solder slug attached thereto by heat-fusion, for reflow soldering of the lead to a respective terminal on a substrate. In the alternative, the solder slug also may be mechanically clamped to the spring finger in a suitable manner.

Since the leads of the lead strip disclosed in the M. S. Schell patent project from a single independent support rail, rather than in opposed relationship from a pair of support rails which are integrally interconnected so as to retain the leads in a fixed spaced relationship, difficulty has been encountered in handling and feeding two of the lead strips in unison from continuous supplies and assembling the leads to opposite sides of respective substrates. Accordingly, the assembling of the leads to the substrates has generally been accomplished manually by cutting lead frames to length from one of the continuous lead strips and then assembling two of the lead frames to respective opposite sides of a substrate in a suitable substrate holding fixture. This procedure, however, is a slow and inefficient process.

A relatively expensive apparatus for automatically feeding a pair of the single rail lead strips is known in which leading sets of leads of the lead strips are assembled to a substrate in succession in spaced first and second assembling positions. In this apparatus the lead strips are intermittently fed from opposite directions to locate successive sets of their leads in the first and second assembling positions, respectively. After each set of leads in the first lead strip has been assembled to a substrate in the first assembling position, and as the first lead strip is indexed to locate its next set of leads in the first assembling position, the lead strip acts as a carrier to move the substrate into the second assembling position. A leading set of leads of the second lead strip, which has been severed from the lead strip by cutting its support rail, then is assembled to the substrate in the second assembling position. The support rail of the first lead strip next is cut to sever its assembled leading set of leads from the remaining leads in the lead strip, the resultant lead-substrate assembly is discharged from the second assembling position, and the cycle of operation is repeated.

The F. V. Brosseit U.S. Pat. No. 3,465,409 discloses a machine for feeding two unconnected metal strips in unison, while fabricating terminals from the strips. At the same time the machine feeds wire from a continuous supply and severs the wire to form pieces of wire of a predetermined length. The formed terminals then are crimped to respective opposite ends of respective ones of the severed wires, and severed from their respective strips. However, this machine is not suitable for feeding a pair of continuous lead strips and assembling the leads of the strips in sets to respective opposite sides of respective substrates.

Accordingly, the purpose of this invention is to provide an improved and economical method and apparatus for assembling solderable-type leads, which project from a single independent support rail in parallel relationship, to opposite sides of a substrate utilizing respective continuous supplies of the leads.

SUMMARY OF THE INVENTION

In general, this invention relates to the assembling of leads to a substrate wherein the leads project in spaced parallel relationship from a continuous independent support rail. In carrying out the invention a pair of the independent support rails may be fed to locate leads on the rails at respective opposite sides of a lead-substrate assembling position. The leads then are moved toward a substrate in the lead-substrate assembling position to assemble the leads to respective opposite sides of the substrate simultaneously. During the assembling operation, inner portions of the leads are engaged to retain terminal-engaging portions of the leads in alignment with respective terminals on the substrate. At the same time the support rails are cut to sever the leads from the remaining leads on the support rails.

More specifically, during the assembling operation the leads are clamped to first and second pusher means by elongated clamping members to retain the terminal-engaging portions of the leads in alignment with their respective terminals on the substrate. The lead clamping members are mounted on respective sets of spaced interconnected arms pivotally mounted on a movable support frame. A first resilient means moves the support frame, which is mounted for universal floating movement, in a first direction to locate the lead clamping members adjacent the leads prior to their assembly to the substrate. A second resilient means on the movable support frame simultaneously pivots the sets of arms to urge the lead clamping members outward into engagement with the inner portions of the leads. As the first and second pusher means and the resiliently biased lead clamping members then cooperate to assemble the leads to the substrate, first and second lead strip support rail cutting means, mounted in part on respective ones of the pusher means, cut the rails to sever the leads from the remaining leads on the rails. Subsequently, after the lead assembling operation, a means moves the movable support frame in a reverse linear direction against the action of the first resilient means.

The substrate is fed into the lead-substrate assembling position by a dual slide mechanism which includes a first slide assembly mounted on a second slide assembly for movement relative to the second slide assembly. A vacuum plate means, for holding the substrate during the feeding operation, forms a part of the first slide assembly, and a camming means, for operating the first and second pusher means, forms a part of the second slide assembly. As the dual slide mechanism is moved such that the vacuum plate means feeds the substrate into the lead-substrate assembling position, the slide assemblies initially move in unison. Subsequently, movement of the substrate and the first slide assembly is interrupted to locate the substrate in the lead-substrate assembling position, whereupon the second slide assembly is moved relative to the first slide assembly such that the camming means pivots actuator arms of the first and second pusher means to cause assembly of the leads in the lead-substrate assembling position to the substrate.

Accordingly, a system for feeding and assembling leads to substrates utilizing a pair of continuous lead strip supplies, wherein the leads project from respective independent continuous support rails in parallel relationship, has been provided.

BRIEF DESCRIPTION OF THE DRAWINGS

FIG. 4A is a plan view of a first portion of an apparatus for assembling sets of leads to a substrate in accordance with this invention;

FIG. 5A is an enlarged elevational view of the portion of the apparatus shown in FIG. 4A;

FIG. 5B is an enlarged elevational view of the portion of the apparatus shown in FIG. 4B;

FIG. 6 is an enlarged partial cross-sectional view taken along the line 6—6 of FIG. 5B;

FIG. 7 is an enlarged elevational view of a portion of the apparatus shown in FIG. 5A, illustrating a substrate feeding operation in accordance with the invention;

FIG. 16 is a timing chart for the apparatus of the invention; and

FIG. 17 is a schematic diagram of a control system for the invention.

DETAILED DESCRIPTION

Figure 2:
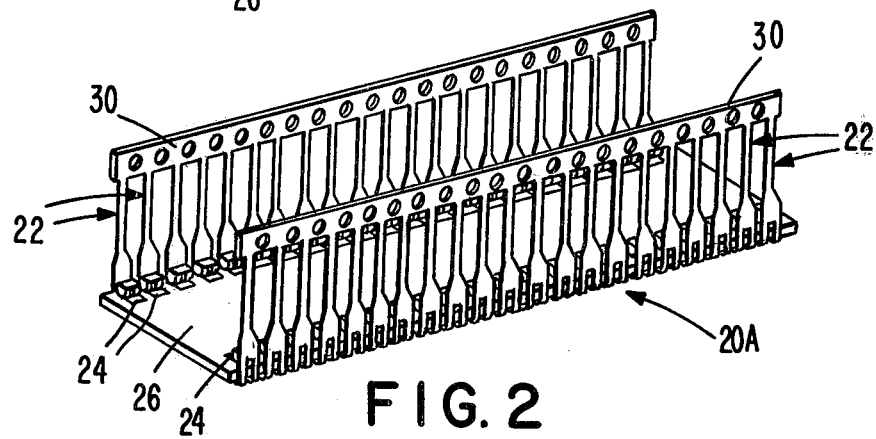
FIG. 2 is an isometric view of a lead-substrate circuit assembly which may be assembled utilizing the subject invention.
Figure 3:
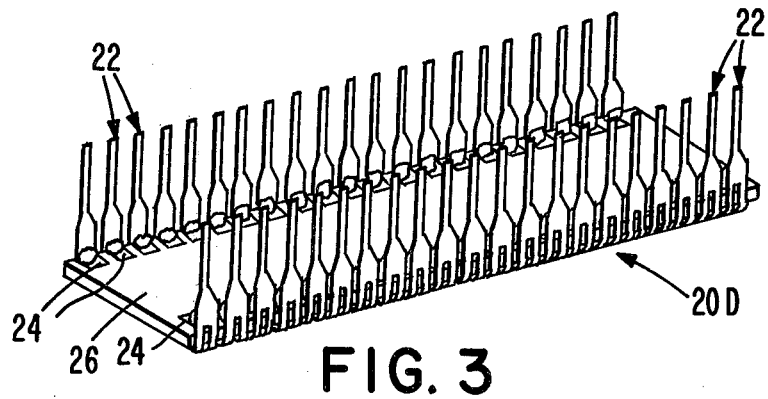
FIG. 3 is an isometric view of the lead-substrate circuit assembly of FIG. 2 after subsequent processing to form a substrate circuit device.

Referring to FIG. 3, the disclosed embodiment of the invention is directed to a system for use in providing a substrate circuit device generally designated by the reference numeral 20D, such as of the thin film type, with first and second sets of leads 22 having inner ends reflow-soldered to terminals or bonding pads 24 on a ceramic or other type substrate 26 along opposite edges thereof. The leads 22 also project from the circuit device 20D in spaced parallel relationship to provide lead outer free end portions which are subsequently connected to additional circuitry, not shown. In this connection, however, the apparatus as disclosed in the drawing is intended to produce a lead-substrate circuit assembly 20A as shown in FIG. 2, with the product as shown in FIG. 3 later being produced in other apparatus, not shown, in connection with subsequent processing.

Figure 1:
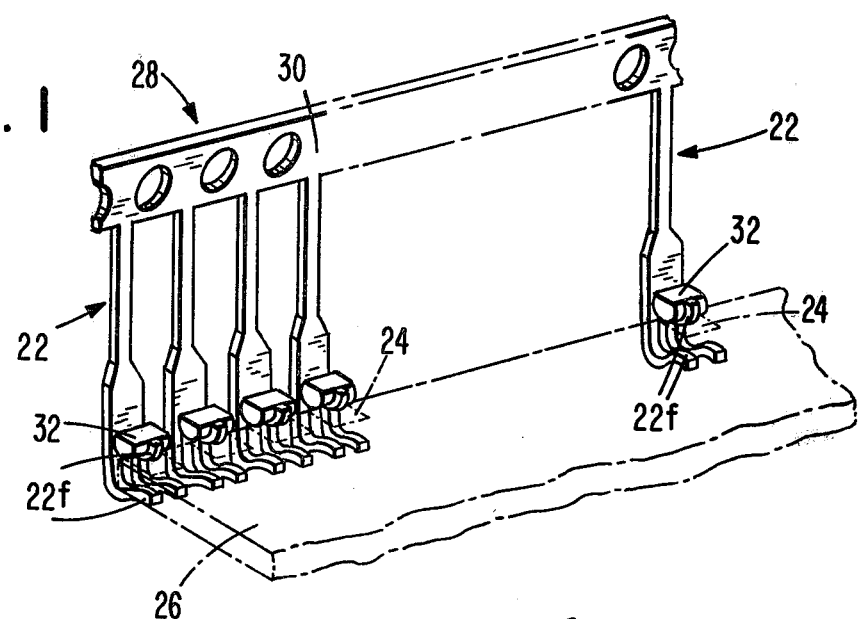
FIG. 1 is an isometric view of a portion of a lead strip which may be assembled to a substrate in accordance with this invention.

Referring to FIG. 1, a lead strip 28 which may be processed with the subject invention includes an elongated continuous support rail 30 having a plurality of the leads 22 projecting therefrom in parallel relationship, with each lead having opposed spring clamping fingers 22f at an outer end thereof for receiving one of the substrates 26 therebetween. In addition, one of the spring fingers 22f of each lead 22 has a solder slug 32 attached thereto (such as by heat fusion) for reflow soldering of the lead to a respective one of the terminals 24 on the substrate 26. The support rail 30 of the lead strip 28 also includes a row of perforations for feeding and locating of the lead strip.

Figure 4B:
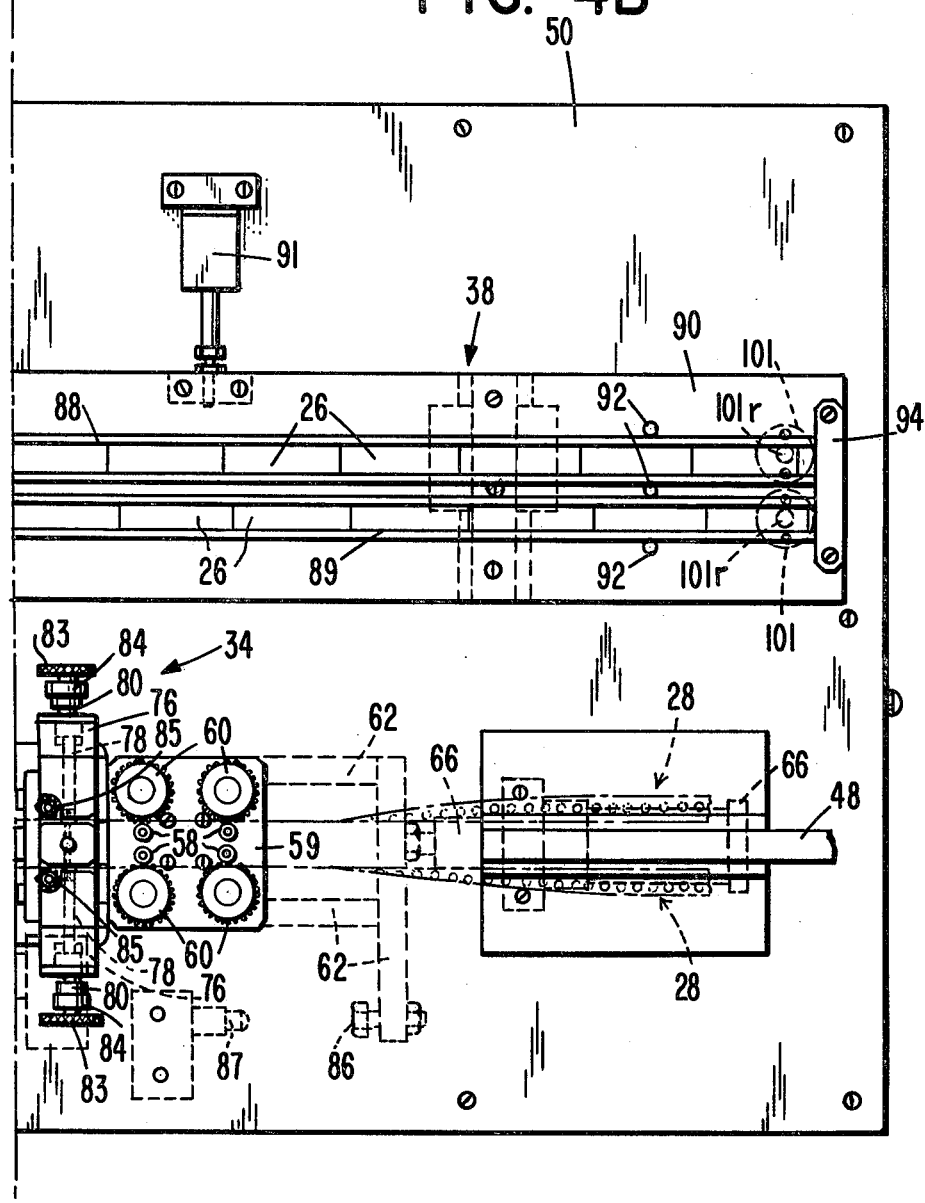
FIG. 4B is a plan view of another portion of the apparatus shown in FIG. 4A.

Referring to FIGS. 4 and 5, in the disclosed embodiment of the invention two of the lead strips 28 are simultaneously fed by a one-way feed mechanism 34 along essentially parallel paths from right to left in these figures, from a pair of supply reels (not shown) to locate successive leading sets of the leads 22 (FIG. 1) in the strips in spaced relationship on respective opposite sides of a lead-substrate assembling position or station 36 (FIGS. 4A and 5A). The substrates 26 are sequentially fed one at a time from a magazine 38 (FIGS. 4A and 4B) into the assembling station 36 by a substrate feeding mechanism 40 (FIGS. 4A and 5A). In this connection, while in FIG. 5 the apparatus is shown in a horizontal position to facilitate illustration, in actual practice the apparatus is intended to be mounted in an inclined operating position so that it slopes downwardly at an angle on the order of 25° from right to left in this figure, to facilitate feeding of the substrates 26 prior to and after assembly of the leads 22 thereto.

Figure 12:
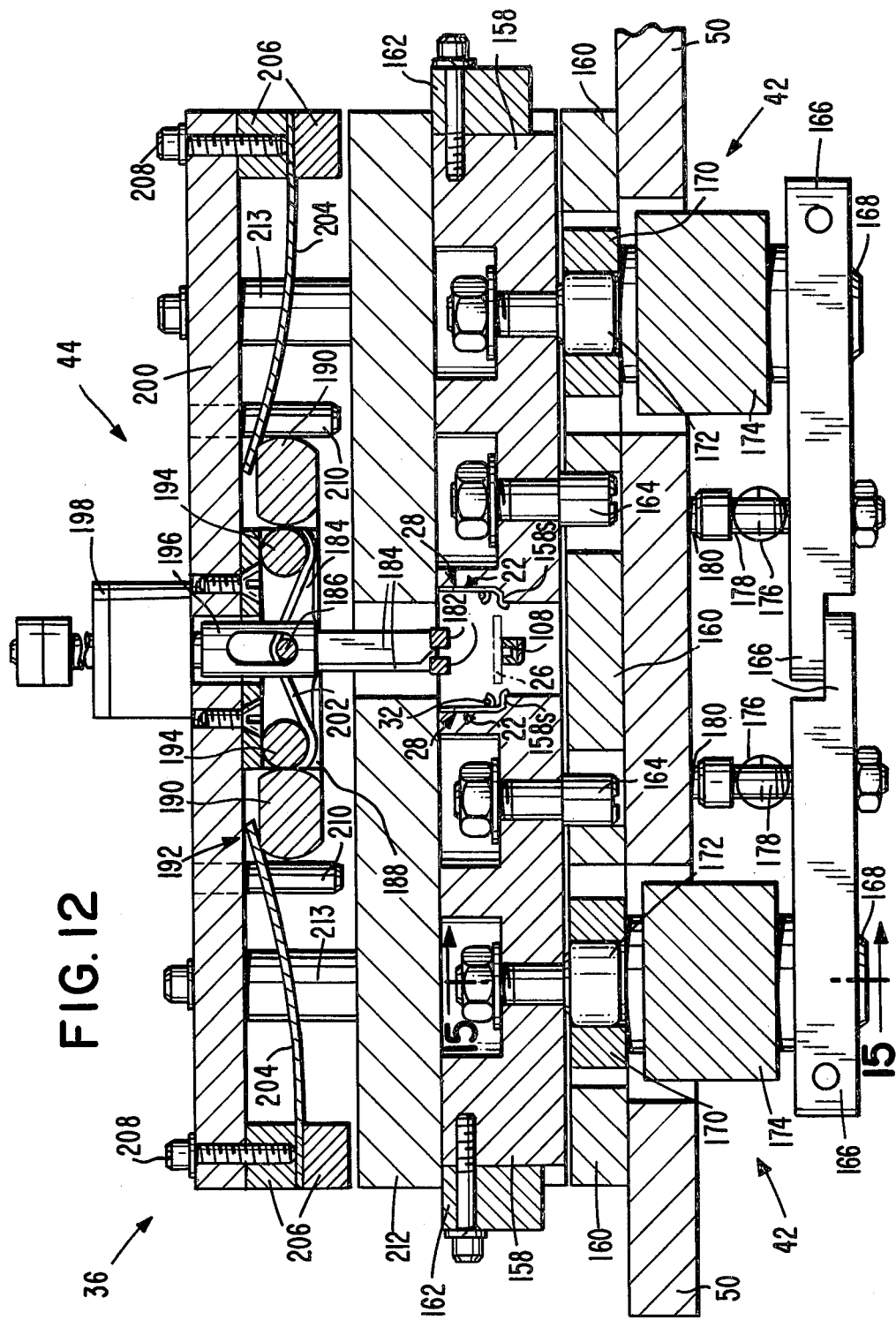
FIG. 12 is an enlarged cross-sectional view taken along the line 12—12 in FIG. 5A, of a portion of the apparatus in a first operating condition.
Figure 13:
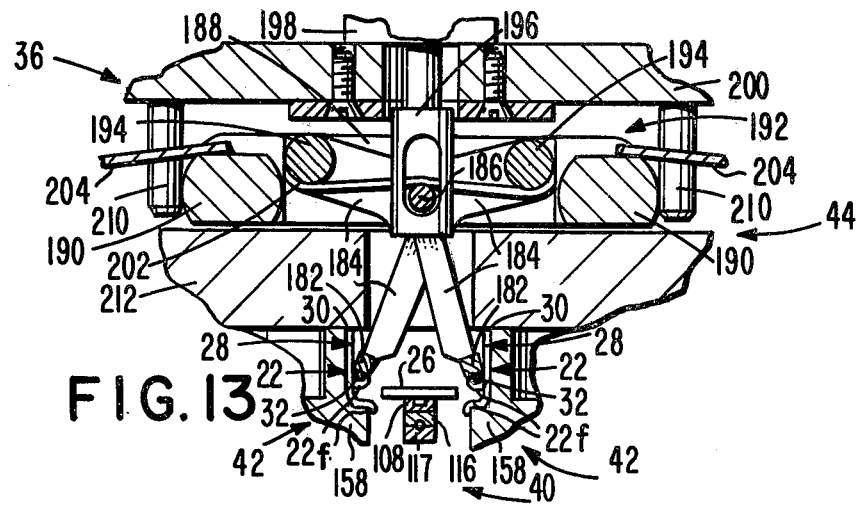
FIG. 13 is an enlarged cross-sectional view of a portion of the apparatus shown in FIG. 12 in a second operating condition.
Figure 14:
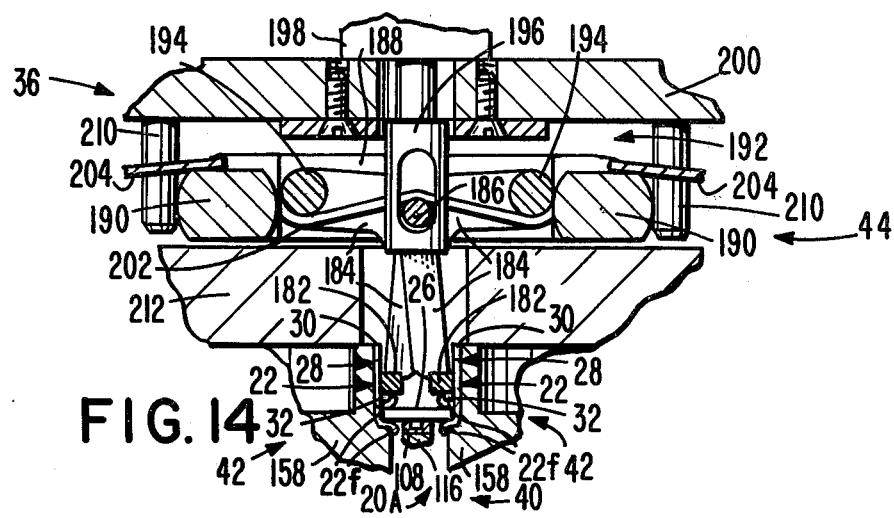
FIG. 14 is an enlarged cross-sectional view of a portion of the apparatus shown in FIG. 12 in a third operating condition.

As is best shown in FIGS. 12–14, in the lead-substrate assembling station 36, the leading sets of the leads 22 are assembled to respective opposite sides of one of the substrates 26 by a pair of pusher-shear mechanisms 42, in cooperation with a lead-alignment retaining mechanism 44. At the same time the pusher-shear mechanisms 42 and a fixed shearing block 46 (FIGS. 8 and 9) cut the rails 30 of the lead strips 28 to sever the leading sets of the leads 22 from the remaining leads in the lead strips, thus forming new leading sets of leads in the lead strips and producing the lead-substrate circuit assembly 20A shown in FIG. 2. The lead-substrate circuit assembly 20A (FIGS. 2 and 14) then is removed from the assembling station 36 by the substrate feeding mechanism 40, and the cycle of operation is repeated.

The above-mentioned supply reels (not shown) are mounted for rotation on horizontal axes on opposite sides of a vertical support plate 48 (FIGS. 4B and 5B) fixedly mounted at its lower end on a horizontal rectangular platform 50. The lead strips 28 are wound on the supply reels with what is known in the art as a "left hand" and a "right hand" wind, respectively, so that the spring clamping fingers 22f (FIG. 1) of the leads in the lead strips pay off the reels in opposed adjacent relationship with respect to respective opposite sides of the vertical support plate 48. The rectangular platform 50 is fixedly supported on a base plate 52 (FIGS. 5A and 5B) in elevated spaced relationship to the base plate by vertical corner posts 53 and the area between the platform and the base plate is enclosed by side plates 54.

Each of the lead strips 28 initially travels from its respective supply reel (not shown) about a peripherally grooved roller 56 (FIG. 5B) between the roller and a series of aligning sprockets 57 having teeth engageable in the perforations in the rail 30 of the lead strip. The roller 56 and the sprockets 57 are mounted for rotation on horizontal axes on the vertical support plate 48. The lead strip 28 then travels to the left in FIGS. 4B and 5B between additional pairs of peripherally grooved rollers 58 (FIG. 4B) and associated toothed aligning sprockets 60, having vertical axes of rotation and mounted on a support block 59 secured to the platform 50. Accordingly, as the lead strips 28 pass between their respective rollers 56, 58 and aligning sprockets 57, 60, the lead strips are rotated 90° in opposite directions as illustrated in FIGS. 4B and 5B to locate the spring clamping fingers 22f of the leads 22 in proper orientation for assembly to the substrate 26, as shown in FIG. 12.

The one-way feed mechanism 34 for advancing the lead strips 28 includes a reciprocable slide 62 (FIGS. 4B and 5B) mounted for horizontal movement in a support block 64 (FIG. 5B) secured to the bottom of the platform 50. The slide 62 is connected at its right-hand end, as viewed in FIG. 5B, to a piston rod of an air cylinder 66, also mounted on the bottom of the platform 50.

Adjacent its left-hand end, as viewed in FIG. 5B, the slide 62 carries a movable first lead strip clamping mechanism 68. As is best shown in FIG. 6, the clamping mechanism 68 includes a U-shaped support block 70 having spaced upstanding legs. The U-shaped support block 70 is fixedly mounted on a spacer block 72 (FIG. 5B) secured to the slide 62 and disposed in a slot in the platform 50 for horizontal movement in the slot. An identical fixed second lead strip clamping mechanism 74 (FIGS. 4A and 5A) is fixedly mounted on the top of the platform 50 in spaced relationship to the movable lead strip clamping mechanism 68 (FIGS. 4B and 5B) mounted on the slide 62.

With further reference to FIG. 6, each of the lead strip clamping mechanisms 68 and 74, as illustrated by the lead strip clamping mechanism 68, includes a small double-acting air cylinder 76 mounted in each of the legs of the U-shaped support block 70 so that a clamping pin 78, which is mounted on a piston rod 76r of the air cylinder by a split collar 80, can clamp a respective one of the lead strips 28 between the pin and an opposed surface of a clamp member 82 fixedly mounted between the legs. The clamping pin 78 also has a projecting essentially conically-shaped tip which is movable through an adjacent one of the perforations in the respective lead strip 28 and which is receivable in a slot in the fixed clamp member 82. The opposite end of the clamping pin 78 has a knurled knob 83 secured thereto by a split collar 84, to facilitate manual retraction of the pin so that the lead strip 28 can be manually advanced between the pin and the fixed clamp member 82. The legs of the U-shaped support block 70 also may have a pair of lead strip guide sprockets 85 (only one shown in FIG. 6) rotatably mounted thereon.

At the beginning of each lead strip advancing operation, the air cylinders 76 of the fixed lead strip clamping mechanism 74 are in an advanced condition and the air cylinders 76 of the movable lead strip clamping mechanism 68 are in a retracted condition. The air cylinders 76 of the movable lead strip clamping mechanism 68 then are energized so that their clamping pins 78 advance to clamp the lead strips 28 to the fixed clamp member 82 of the clamping mechanism as illustrated in FIG. 6, with the conically-shaped tips of the clamping pins passing through adjacent aligned ones of the perforations in the lead strip support rails 30. The air cylinders 76 of the fixed lead strip clamping mechanism 74 then are operated to retract their associated clamping pins 78 to permit feeding of the lead strips 28 through the fixed clamping mechanism.

Figure 8:
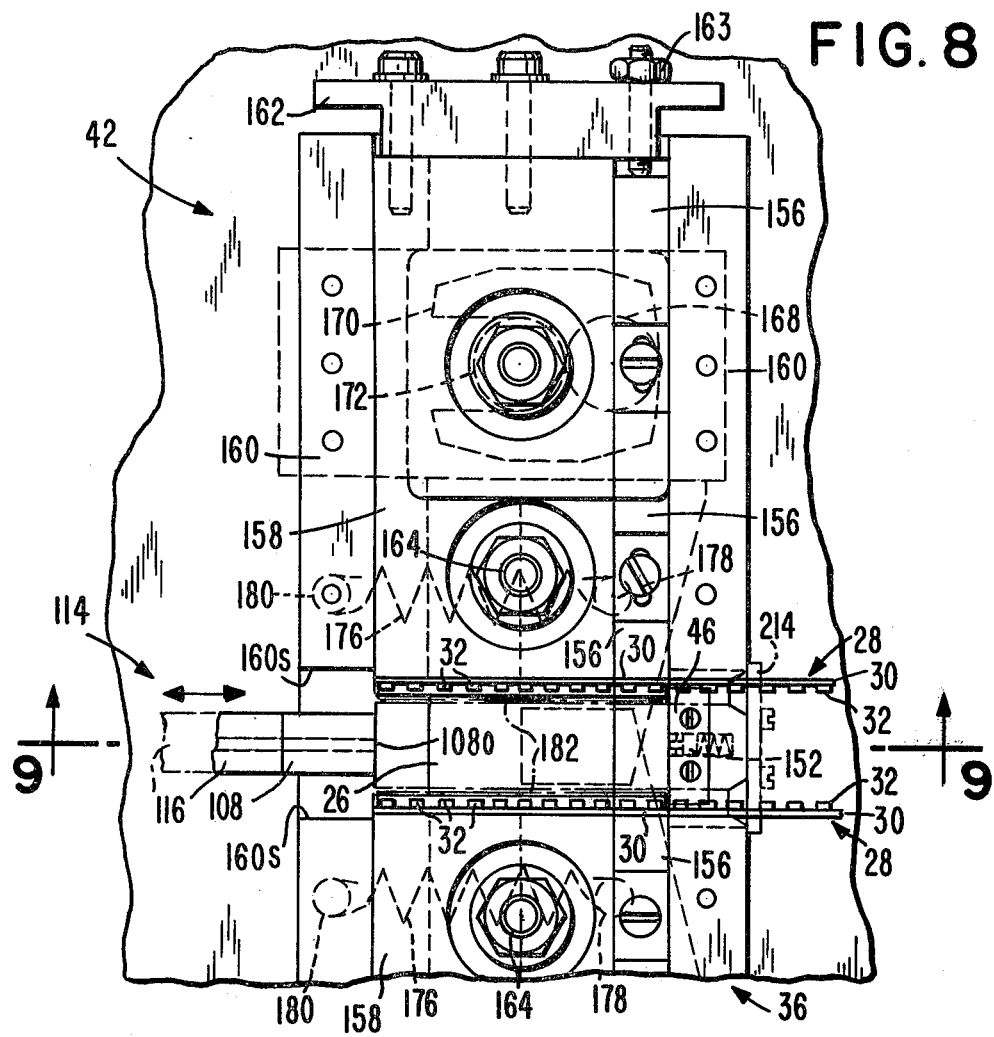
FIG. 8 is an enlarged partial cross-sectional view of the apparatus taken along the line 8—8 in FIG. 5A, with a lead-alignment retaining mechanism of the apparatus removed.
Figure 9:
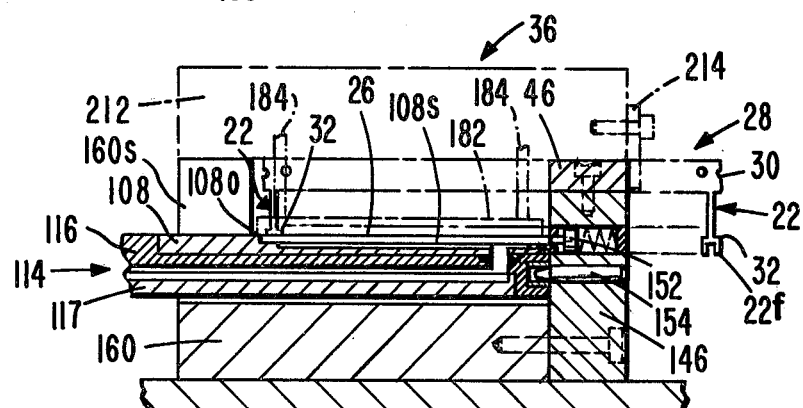
FIG. 9 is a cross-sectional view taken along the line 9—9 in FIG. 8.

The lead strip feed cylinder 66 (FIG. 5B) then is actuated to advance the slide 62, the first lead strip clamping mechanism 68 thereon and the clamped lead strips 28 to the left as illustrated by broken lines in FIG. 5B, to advance the leading sets of the leads 22 in the strips into the lead-substrate assembling station 36 as shown in FIGS. 8 and 9. Movement of the slide 62, to locate the leading sets of the leads 22 properly in the assembling station 36, is limited by the slide engaging an adjustable stop pin 62s (right-hand side of FIG. 5A) suitably mounted beneath the platform 50. At the same time, as is shown in broken lines in FIG. 5B, an adjustable actuator screw 86 on the slide 62 operates a limit switch 87 mounted beneath the platform 50.

The air cylinders 76 of the fixed lead strip clamping mechanism 74 then are operated to advance their respective clamping pins 78 (FIGS. 4A and 6) into aligned perforations in the lead strip support rails 30, to locate the leading sets of the leads 22 precisely in the lead-substrate assembling station 36 and to prevent retrograde movement of the lead strips 28. Next, the air cylinders 76 of the movable lead strip clamping mechanism 68 are operated to retract their respective pins 78 from associated ones of the perforations in the lead strip support rails 30. The lead strip feed cylinder 66 then is operated to return the slide 62 and the movable lead strip clamping mechanism 68 to the right in FIGS. 4B and 5B to their initial positions in preparation for the next lead strip feeding operation.

The magazine 38 from which the substrates 26 are fed into the lead-substrate assembling station 36 includes a pair of channel-shaped feed tracks 88 and 89 (FIGS. 4 and 5) supported on a load plate member 90. The load plate 90 is reciprocable in suitable guideways fixedly mounted on the top of the platform 50, by an air cylinder 91 (best shown in FIG. 4B) also mounted on the top of the platform 50. When the apparatus (including the load plate 90) is mounted in an inclined operating position as above-described, the feed tracks 88 and 89 are thus also inclined downward to facilitate gravity feeding of the substrates 26 therein from right to left in FIGS. 4 and 5.

Preferably, the feed tracks 88 and 89 are of a known portable type which can be preloaded with substrates 26 at a prior processing station (forming no part of this invention and not shown) and manually positioned on the load plate 90 between upwardly projecting retaining pins 92 mounted on the load plate, an end bar 94 (FIGS. 4B and 5B) also mounted on the load plate, and an escapement bar 96 (FIGS. 4A and 5A) mounted on one side of a substrate feed table 98 of the substrate feeding mechanism 40. The left-hand ends (FIG. 4A) of the feed tracks 88 and 89 are slidably received between a plastic guide member 99 also mounted on the one side of the substrate feed table 98, and a projecting portion of a plastic guide member 100 secured to the top of the escapement bar 96.

Referring to FIG. 4A, the load plate 90 is movable between first and second positions in which the substrates 26 in one or the other of the first and second inclined feed tracks 88 and 89 can feed by gravity through a slot in the escapement bar 96 mounted on the substrate feed table 98. By way of example, when the last substrate 26 in the first feed track 88 feeds therefrom, the load plate 90 is moved from its first position, in which the first feed track is in alignment with the slot in the escapement bar 96, to its second position in which the second feed track 89 is in alignment with the slot in the escapement bar. As substrates 26 than feed from the second feed track 89, the empty first feed track 88 may be manually replaced with another preloaded feed track.

When all of the substrates 26 have been fed from the second feed track 89, the load plate 90 is moved back to its initial first position so that the substrates 26 in the replaced first feed track 88 can feed through the slot in the escapement bar 96, and the second feed track is replaced with another preloaded feed track. Accordingly, the substrates 26 can be fed from the magazine 38 without interruption and stopping of the apparatus. If desired, feeding of the substrates 26 down each of the feed tracks 88 and 89 may be facilitated by jarring or jiggling the feed track in a suitable manner, such as by intermittently operating small air cylinders 101 (FIGS. 4B and 5B) mounted beneath the platform 50 and having piston rods 101r extending through the platform and engageable with the bottoms of the feed tracks.

The substrate feed table 98 (FIGS. 4A and 5A) of the substrate feeding mechanism 40 is secured to the top of the horizontal platform 50 and a substrate guide rail 102 is secured to the top of the feed table. The guide rail 102 and an undercut portion of the escapement bar 96 define a guideway for feeding of the substrates 26 along the feed table 98. When one of the substrates 26 has fed from its associated feed track 88 and 89 onto the feed table 98, an air cylinder 104 (best shown in FIG. 4A), which is mounted on an extension of the feed table, is energized to advance a pusher block 106 which then advances the substrate along the feed table one increment. This causes a row of previously fed (or positioned) substrates 26 on the feed table 98 to be advanced so that a leading one of the substrates is advanced into a position over a vacuum plate 108 of a horizontally reciprocable dual slide mechanism 110 (best shown in FIGS. 5A and 7). When the air cylinder 104 is de-energized to retract the pusher member 106, another one of the substrates 26 feeds from the feed track 88 or 89 then in alignment with the slot in the escapement bar 96 onto the feed table 98 for the next feeding cycle.

Energization of the air cylinder 104 is controlled by a photoelectric detector device 112 (FIG. 4A) of a known type mounted on the guide rail 102. For example, the detector device 112 may include a light-emitting diode transmitter and a receiver mounted so that light from the transmitter is reflected by one of the substrates 26 as it is fed from either of the feed tracks 88 or 89 onto the feed table 98, to cause the receiver to change state and cause energization of the air cylinder 104. A photoelectric detector device 113 (FIG. 4A) of this same type also may be suitably mounted on the bottom of the platform 50, with viewing slots (not shown) being formed in the platform and the escapement bar 96, for detecting when the last substrate in each of the feed tracks 88 or 89 has fed therefrom and controlling operation of the load plate air cylinder 91 (FIG. 4B) as described hereinabove.

As is best shown in FIGS. 4A, 5A and 9, the vacuum plate 108 forms a part of a secondary slide assembly 114 of the dual slide mechanism 110 (FIG. 5A) and is fixedly mounted on one end of a support block 116. At its other end the support block 116 has a vacuum fitting 118 (FIGS. 4A and 5A) mounted thereon in communication with a passageway defined by opposed grooves in the support block and a bottom plate 117 secured thereto, the passageway being in communication with a vacuum port in the support block and the vacuum plate 108. The vacuum plate 108 also includes a narrow shallow slot 108s (FIGS. 4A and 9) to facilitate vacuum retention of one of the substrates 26 thereon.

The support block 116 is suitably mounted on the top of a spacer block 120 (best shown in FIG. 5A) which is disposed in an elongated slot in the platform 50 and secured to a plate member 121 mounted on a secondary slide member 122 located beneath the platform. The secondary slide member 122 is mounted for horizontal reciprocable movement in a guide block 124 secured to the top of a main slide assembly 128 of the dual slide mechanism 110. The main slide assembly 128 is mounted for horizontal reciprocable movement in a guide block 130 secured to the top of the base plate 52. A support block 132 for a cam roller 134 is fixedly secured to the top of the main slide assembly 128. The right-hand end of the main slide assembly 128, as viewed in FIGS. 5A and 7, is suitably secured to a piston rod of an air cylinder 136 which also is mounted on the top of the base plate 52, as shown in FIG. 5B.

Upon retraction of the pusher block air cylinder 104, the dual slide mechanism 110 is moved to the right in FIGS. 5A and 7 by the air cylinder 136 to advance the substrate 26 then on the vacuum plate 108 into the lead-substrate assembling station 36. During an initial portion of this movement of the dual slide mechanism 110, an adjustable spacer screw 142 on the secondary slide member 122 of the secondary slide assembly 114 is retained in engagement with the cam roller support block 132 by a coil spring 144 connected between the support block and the plate member 121 on the secondary slide member, as shown in FIG. 5A. Then, when the vacuum plate support block 116 engages a fixed lead strip guide block 146 (best shown in FIG. 9) in the assembling station 36, movement of the secondary slide assembly 114 is interrupted while the main slide assembly 128 continues moving against the action of the coil spring 144, as shown in FIG. 7.

During the latter movement of the main slide assembly 128, the cam roller 134 causes operation of the pair of opposed pusher-shear mechanisms 42 (best shown in FIG. 12) from retracted positions into advanced positions, with the pusher-shear mechanisms initially cooperating with the shearing block 46 (FIG. 8) to sever the lead strip support rails 30 and then pushing the severed leading sets of the leads 22 onto the substrate 26 under uniform speed and pressure. Reversal of the air cylinder 136 to return the dual slide mechanism 110 (including the main slide assembly 128) to its initial position in FIG. 5A is accomplished in response to operation of a limit switch 150 (FIG. 5B) by the main slide assembly.

Referring to FIG. 9, as the substrate 26 on the vacuum plate 108 is fed into the lead-substrate assembling station 36, the substrate engages a spring loaded pin 152 mounted in the lead strip guide block 146 to seat the substrate against a back orienting surface 108o of the vacuum plate. At the same time, an elevation alignment pin 154, which is fixedly mounted in the lead strip guide block 146, is received in a bushing in the vacuum plate support block 116 as the support block engages the guide block as above described, to insure proper horizontal alignment of the substrate 26 with the spring fingers 22f of the leads 22 in the assembling station 36.

Referring to FIGS. 12 and 13, after the lead strips 28 have been advanced by the one-way feed mechanism 34 (FIGS. 4B and 5B) to locate the leading sets of the leads 22 in the lead-substrate assembling station 36 as shown in FIG. 12, the lead alignment retaining mechanism 44 is operated to engage inner portions of the lead stems and the solder slugs 32 on the spring clamping fingers 22f of these leads, substantially as shown in FIG. 13. As the pusher-shear mechanisms 42 then are subsequently moved inward toward one another by the cam roller 134 of the dual slide assembly 110 to assemble the leading sets of the leads 22 to the substrate 26 being supported on the vacuum plate 108, cutting blades 156 (FIG. 8) of the pusher-shear mechanisms 42 initially cooperate with respective cutting edges of the fixed shearing block 46 (FIG. 8) to cut the support rails 30 of the lead strips 28 to sever the leading sets of the leads 22 from the remaining leads on the support rails. The lead alignment retaining mechanism 44 then firmly clamps the severed leading sets of the leads 22 to the pusher-shear mechanisms 42 to retain the spring clamping fingers 22f of the leads 22 in alignment with their respective terminals 24 (FIGS. 1-3) on the substrate 26. Continued inward movement of the pusher-shear mechanisms 42 then seats the leading sets of the leads 22 on the substrate 26, with opposite edge portions of the substrate being received between the spring clamping fingers 22f of the leads, as shown in FIG. 14.

Referring to FIGS. 8 and 12, each of the pusher-shear mechanisms 42 comprises a pusher slide 158 mounted in a guideway defined by a channel-shaped guide block 160 secured to the top of the platform 50. The associated lead strip rail cutting blade 156 (FIG. 8) is adjustably mounted, by means of slots in the cutting blade and suitable screws, in a slot in the upper portion of the pusher slide 158. At an outer end the pusher slide 158 has a plate 162 secured thereto, which carries an adjusting screw 163 for providing a fine adjustment of the position of the rail cutting blade 156. At an inner end the pusher slide 158 includes a seat portion 158s (FIG. 12) for receiving the leads 22 of its respective lead strip 28. A stop pin 164 for limiting inward and outward movement of the pusher slide 158 also is mounted on the pusher slide and extends into a slot (FIG. 12) in the guide block 160.

As is best shown in FIGS. 8 and 9, the fixed shearing block 46 is mounted on the lead strip guide block 146, which is secured to the slide guide block 160, with the shearing block and the lead strip guide block being disposed in a slot in one side of the slide guide block. the slide guide block 160 also includes a slot 160s in the opposite side thereof for feeding of the substrates 26 into the lead-substrate assembling station 36.

Figure 15:
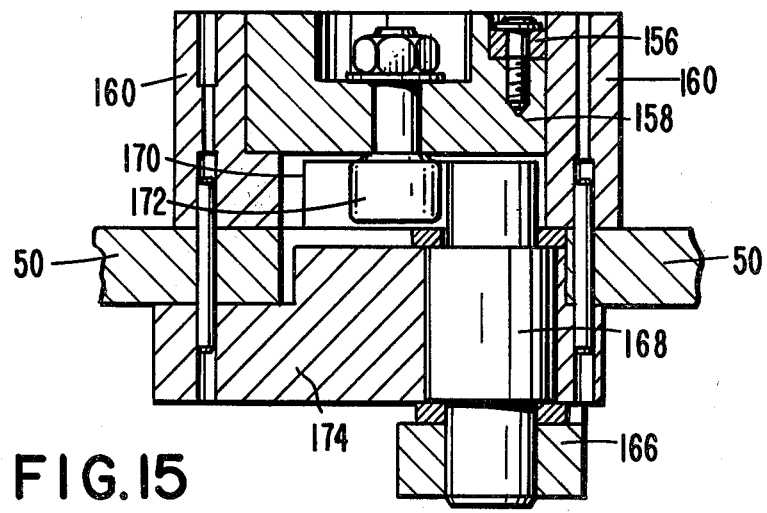
FIG. 15 is a cross-sectional view taken along the line 15—15 in FIG. 12.

In operating the pusher-shear mechanisms 42, the cam follower 134 on the main slide assembly 128 engages a pair of pivoted actuator arms 166 (FIG. 12) to cause simultaneous inward movement of the pusher slides 158 as shown in FIG. 14, thereby assembling the leading sets of the leads 22 in the lead-substrate assembling station 36 onto the substrate 26 under uniform speed and pressure as above described. More specifically, pivoting of the actuator arms 166 causes rotation of respective vertical shafts 168 (FIG. 15) on which the actuator arms are fixedly mounted at the lower ends of the shafts. This rotation of the vertical shafts 168, by means of fork members 170 secured to the upper ends of the shafts, and cam rollers 172 disposed between legs of the fork members and mounted on the pusher slides 158, then moves the pusher slides inward toward one another. The vertical shafts 168 are mounted for rotation in respective mounting blocks 174 secured to the underside of the platform 50. The actuator arms 166 are biased toward their initial positions by respective coil springs 176 (FIGS. 5A, 8 and 12) connected between pins 178 mounted on the actuator arms and depending pins 180 mounted on the underside of the platform 50.

Figure 10:
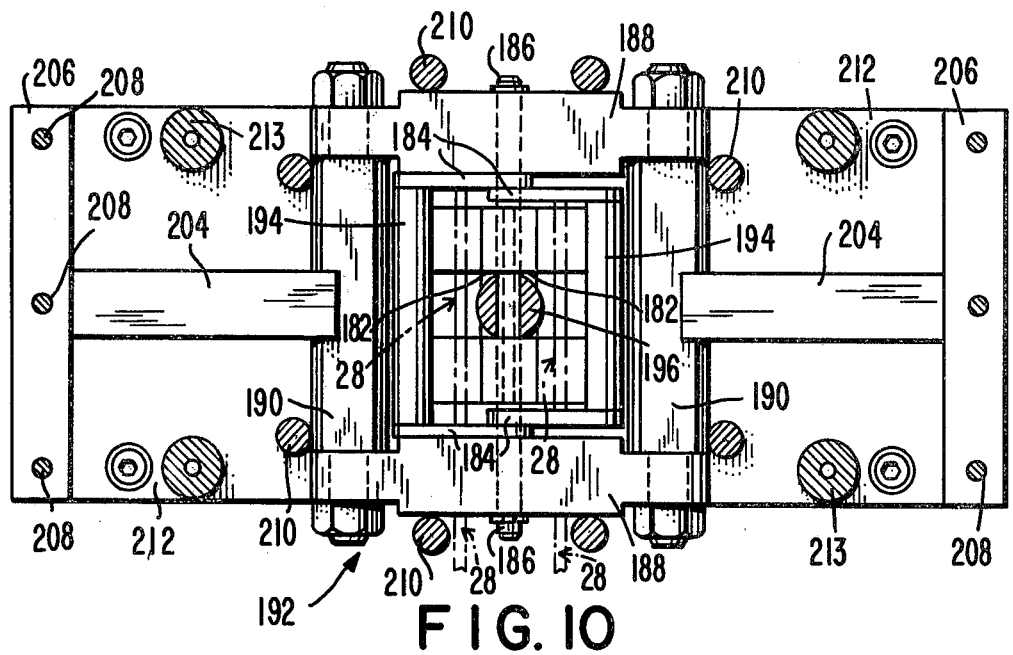
FIG. 10 is an enlarged cross-sectional view taken along the line 10—10 in FIG. 5A.

Referring to FIGS. 10 and 12-14, the lead alignment retaining mechanism 44 includes a pair of elongated clamping bars 182 of square cross section for engaging the inner stem portions of the leads 22 and the solder slugs 32 on the leads during an assembly operation. Each of the clamping bars 182 is secured, such as by welding, to lower ends of first legs of a respective pair of bell crank arms 184. The bell crank arms 184 include second legs disposed at essentially right angles to their first legs and the arms are mounted for pivotal movement at junctions of their first and second legs on an elongated support pin 186. The pin 186 is fixedly mounted at its opposite ends in apertures in a pair of vertically movable support rods 188. As is best shown in FIG. 10, opposite ends of the support rods 188 are mounted on screw-threaded extensions of a second pair of support rods 190 to form a vertically movable rectangular support frame 192. Outer ends of the second legs of the bell crank arms 184 are interconnected by respective rod members 194, to which they are secured, such as by welding.

As is best shown in FIG. 12, the support pin 186 for the bell crank arms 184 is disposed at its center in a slot in a vertically movable actuator rod 196 connected to a piston rod of a double-acting air cylinder 198 mounted on an upper support plate 200. The support pin 186 is biased toward the lower end of the slot of the actuator rod 196 by a secondary leaf spring 202 engaged with the support pin at its center and engaged with the arm connecting rods 194 at its outer ends.

Figure 11:
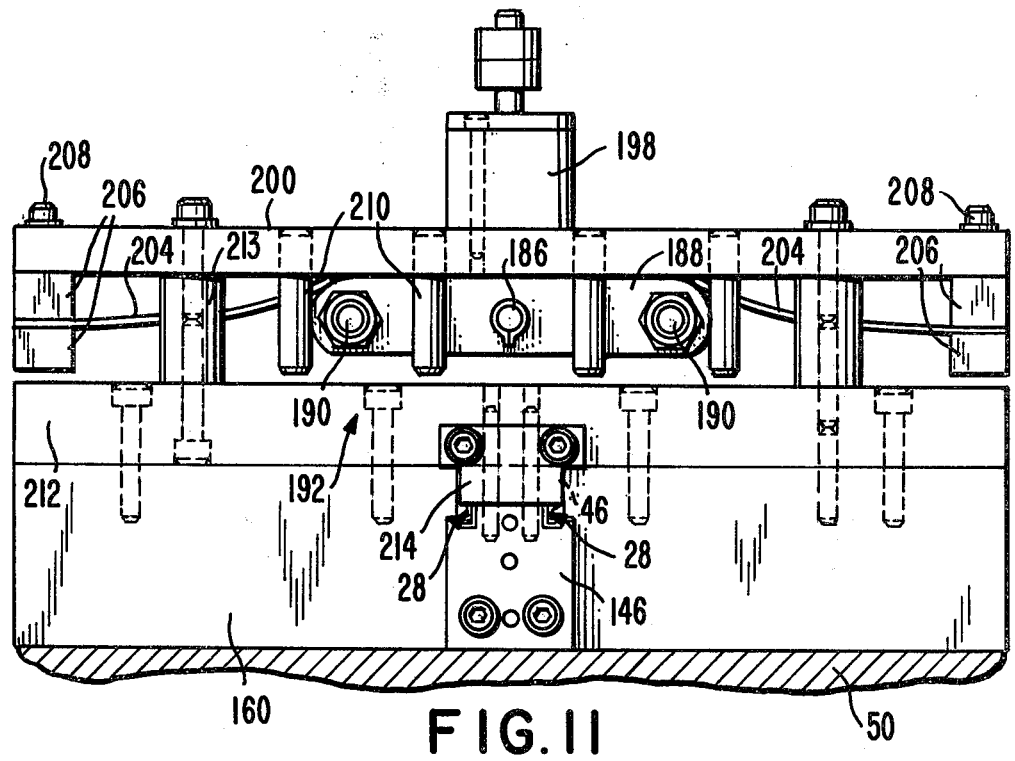
FIG. 11 is an enlarged cross-sectional view taken along the line 11—11 in FIG. 5A.

The rectangular frame 192 formed by the support rods 188 and 190 is biased downward by a pair of primary leaf springs 204 each mounted at one end beneath the upper support plate 200 between upper and lower clamping bars 206 and having an inner free end in biasing engagement with a respective one of the support rods 190. The clamping bars 206 are secured to the upper support plate 200 by screws 208 (best shown in FIG. 5A). The rectangular frame 192 is confined for vertical universal floating movement, within limits, by a plurality of depending pins 210 projecting from the bottom of the upper support plate 200. The upper support plate 200 is fixedly mounted on a lower support plate 212 by a plurality of cylindrical spacer members 213 and suitable screws. As is best shown in FIG. 11, the lower support plate 212 is mounted on the top of the channel-shaped guide member 160 for the pusher-shear mechanisms 42. Further, an essentially T-shaped lead strip guide member 214 (FIG. 11) is mounted on the lower support plate 212 in cooperative relationship to the lead strip guide member 146, which also is mounted on the channel-shaped guide member 160 as above described.

When the leading sets of the leads 22 are initially fed into the lead-substrate assembling station 36, the bell crank arms 184 are in an upward inwardly retracted position, as shown in FIG. 12. The bell crank arms 184 then are moved downward and simultaneously pivoted into outward advanced positions in which the lead clamping bars 182 engage the inner stem portions of the leads 22 and the solder slugs 32 on the leads as shown in FIG. 13. More specifically, upon energization of the double-acting air cylinder 198 to move the actuator rod 196 to a lower extended position, the secondary leaf spring 202 causes the bell crank arms 184 to pivot in first directions on their support pin 186 so that the lead clamping bars 182 on the arms move outward away from one another. At the same time the primary leaf springs 204 insure downward linear movement of the rectangular support frame 192, and thus of the lead clamping bars 182, in a direction essentially perpendicular to the outward movement of the bars, whereby the bars move into engagement with both the inner stem portions of the leads 22 and the solder slugs 32 on the leads.

Referring to FIG. 14, as the leading sets of the leads 22 in the lead-substrate assembling station 36 then are severed from the remaining leads in the lead strips 28 and assembled to the substrate 26 by the pusher-shear mechanisms 42, the lead clamping bars 182 retain the severed leads in alignment with their respective terminals 24 (FIGS. 1, 2 and 3) on the substrate. During the lead assembling operation, the movement of the leads 22 onto the substrate 26 causes the lead clamping bars 182 to be moved inward toward one another, causing the bell crank arms 184 on which they are mounted to pivot on their support pin 186 in reverse directions against the biasing action of the secondary leaf spring 202, as shown in FIG. 14.

The double-acting air cylinder 198 then is energized to move the actuator rod 196, and thus the support pin 186, upward to move the rectangular frame 192 linearly upward back into its upper position, as shown in FIG. 12. At the same time, as the bell crank arms 184 engage a suitable stop plate mounted under the upper support plate 200, the upward movement of the support pin 186 causes further pivoting of the bell crank arms in opposite directions so that the first legs thereof move inward toward one another back to their initial positions as shown in FIG. 12, to disengage the lead clamping bars 182 from the assembled leads 22.

As the air cylinders 136 (FIGS. 5A and 5B) then is energized to move the dual slide mechanism 110 (including the vacuum plate 108) from its advanced position as shown in FIG. 7, toward its retracted position as shown in FIG. 5A, the cam roller 134 on the main slide assembly 128 is retracted from engagement with the actuator arms 166 of the pusher-shear mechanisms 42, thus permitting the actuator arms to be moved back to their initial positions by their biasing springs 176. Referring to FIGS. 8 and 12, the movement of the actuator arms 166 to their initial positions, through their mounting shafts 168, the fork members 170 and the cam rollers 172 on the pusher slides 158 of the pusher-shear mechanisms 42, then causes simultaneous retraction of the pusher slides to their initial positions and disengagement of the pusher slides from the assembled leads 22 (FIG. 14) on the substrate 26.

During the retraction of the dual slide mechanism 110, the cam roller support block 132 (FIG. 7) of the main slide assembly 128 engages the adjustable spacer screw 142 of the secondary slide assembly 114 to cause the secondary slide assembly, and thus the vacuum plate 108 thereof, to be retracted with the main slide assembly. As the vacuum plate 108 is retracted, it then moves the lead-substrate circuit assembly 20A therewith out of the lead-substrate assembling station 36. Subsequently, the lead-substrate circuit assembly 20A engages the escapement bar 96 on the substrate feed table 98, causing the lead-substrate circuit assembly to be stripped from the vacuum plate 108 and to drop onto a lower discharge shelf 215 mounted on the top of the platform 50. When the dual slide assembly 110 reaches its retracted position in FIG. 5A, an adjustable actuator screw 216 of the secondary slide block 122 closes a limit switch 217 to condition the apparatus for continued operation.

Referring to FIG. 4A, each stripped lead-substrate circuit assembly 20A is pushed from the discharge shelf 215 into a chute 218 by advancement of an air cylinder 219 having a plastic pusher block 220 secured to a piston rod thereof. The chute 218 and the air cylinder 219 are both mounted on the platform 50. When the air cylinder 219 subsequently is retracted, an actuator bar 223 on a second piston rod thereof and depending through a slot in the platform 50, operates a limit switch 224 (FIG. 5A) mounted beneath the platform, to condition the apparatus for continues operation.

As a result of the apparatus being inclined from right-to-left for operation as noted hereinabove, as each lead-substrate circuit assembly 20A is discharged into the chute 218, the assembly slides by gravity down the chute to a position at the lower left in FIG. 4A where the assembly can be manually removed from the chute and positioned in a transporter tray 226 resting on a cover-type shelf 228 mounted on the platform 50 at the upper left of this figure. Subsequently, when the tray 226 has been filled with the lead-substrate circuit assemblies 20A, the tray is removed from the shelf 228 and the assemblies in the tray are transported therein to another position (not shown) for additional processing, including wave soldering of the leads 22 (FIGS. 1 and 2) to the terminals 24 on the substrate 26 as shown in FIG. 3. The support rails 30 then are clipped from the soldered leads 22 to form the finished substrate circuit device 20D as shown in FIG. 3.

Figure 16:
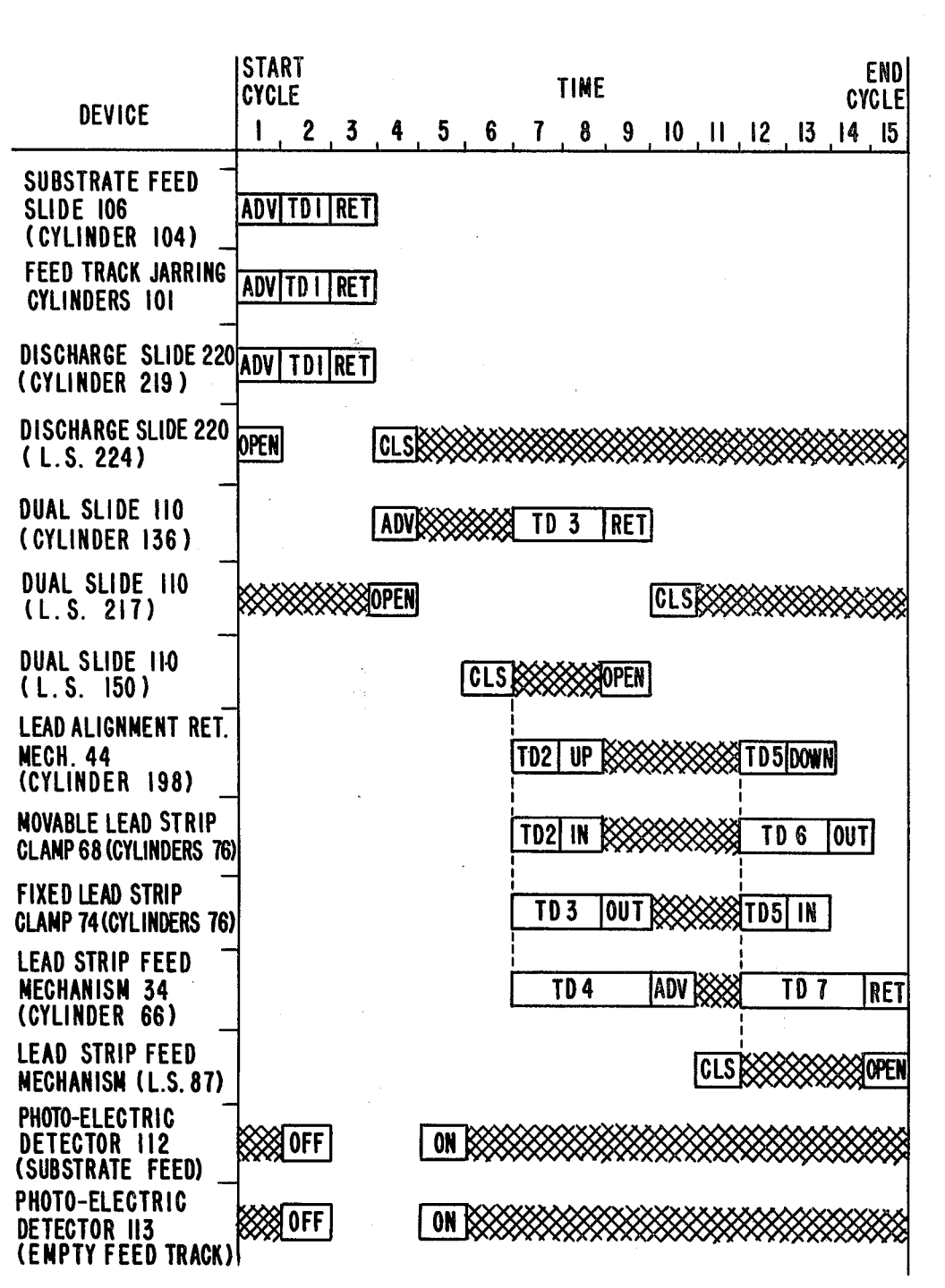

FIG. 16 discloses a timing chart illustrating a sequence of operation for the apparatus as above described. Control of the apparatus to produce the desired operating sequence as shown in FIG. 16 can be accomplished in various manners utilizing a controller 230 (FIG. 17) which may be a programmed or punch-tape type device, contain suitable logic circuitry (not shown) or include a timing cam (not shown) and associated electrical circuits (not shown). The controller 230 may cooperate with appropriately located detecting devices on the apparatus, such as the limit switches 87, 150, 217 and 224, and the photoelectric detectors 112 and 113, described hereinabove and shown in FIG. 17.

FIG. 16 discloses a system in which, for a first cycle of operation, the lead strips 28 have been manually threaded through the apparatus to locate leading sets of leads 22 in the lead-substrate assembling station 36 for an assembly operation. Thus, the initial steps in the operating cycle involve feeding of one of the substrates 26 into the assembling station 36 and assembling the prepositioned leading sets of leads 22 to the substrate. In this connection, however, it is apparent that the first leading sets of leads 22 in the lead strips 28 initially could be manually positioned outside the assembling station 36 and the operating cycle of the apparatus could begin with feeding of the lead strips into the assembling station, if so desired.

With further reference to FIG. 17, at the beginning of an operating cycle, with an air supply 232 having been connected to the system by closure of a manual switch 234 to energize a solenoid valve 236, and with a vacuum pump 237 operating and connected to the vacuum plate 108, the apparatus is in a start condition as shown in this figure. The substrate feed slide 106, the dual slide mechanism 110 and the lead-substrate circuit assembly discharge slide 220 are in retracted positions, with the dual slide mechanism and the discharge slide holding their respective limit switches 217 and 224 in a closed condition, and with the limit switch 150 associated with the dual slide mechanism being in open condition. The lead alignment retaining mechanism 44 and its operating cylinder 198 are in a down position, to clamp the leading sets of leads 22 in the assembling station 36 to the pusher slides 158 of the pusher-shear mechanisms 42. The lead strip feed mechanism 34 is in a retracted condition, whereby its associated limit switch 87 is open. The clamping cylinders 76 of the movable lead strip clamping mechanism 68 are in a retracted condition, and the clamping cylinders 76 of the fixed lead strip clamping mechanism 74 are in an advanced position with its clamping pins 78 extending through aligned perforations in the lead strips 28. The feed track jarring cylinders 101 are retracted and the photoelectric detectors 112 and 113 are energized.

Upon the depressing of a start button (not shown) in the controller 230, a solenoid valve 238 is energized to operate the cylinder 104 so that the substrate feed slide 106 advances one of the substrates 26 on the feed table 98 onto the vacuum plate 108 of the dual slide mechanism 110. The solenoid valve 238 also operates the air cylinder 219 to advance the discharge slide 220, thus opening the limit switch 224, and operates the feed track jarring cylinders 101 to facilitate feeding of the substrates 26 in the feed track 88 or 89 then in feeding position.

After a predetermined time delay TD1 (FIG. 16), the controller 230 de-energizes the solenoid valve 238 to cause retraction of the air cylinders 101, 104 and 219, with the air cylinders 104 and 219 returning the substrate feed slide 106 and the discharge slide 220, respectively, to their retracted positions. As the discharge slide 220 returns to its retracted position, the limit switch 224, which opened upon advancement of the discharge slide, is reclosed by the depending actuator bar 223 on the second piston rod of the air cylinder 219.

As is illustrated in FIG. 16, to preclude de-energization of the apparatus during the feeding of the substrates 26 along the feed table 98, and to preclude inadvertent shifting of the load plate 90 and the substrate feed tracks 88 and 89 thereon during the feeding of one of the substrates 26 from the feed track then in feeding position onto the feed table, the substrate sensing photoelectric detector 112 and the "empty" track photoelectric detector 113 are temporarily de-energized by the controller 230 during this portion of the substrate feeding operation.

After the substrate feed slide 106 is retracted, if the next substrate 26 does not feed from the feed track 88 or 89 then in feeding position, the photoelectric detector 112 produces a signal to the controller 230 to stop the apparatus. Similarly, when the last substrate feeds from the feed track 88 or 89 then in feeding position, the photoelectric detector 113 produces a signal to the controller 230, which operates a solenoid valve 239 to cause the air cylinder 91 to shift the load plate 90 so as to move the empty feed track 88 or 89 out of the feeding position and the full feed track 88 or 89 into feeding position.

Upon closure of the limit switch 224 by retraction of the discharge slide 220, the controller 230 energizes a solenoid valve 240 to operate the air cylinder 136, which then advances the dual slide mechanism 110, including the fed substrate 26 on the vacuum plate 108, into the lead-substrate assembling station 36. Advancement of the dual slide mechanism 110 opens the limit switch 217.

After the substrate 26 has been fed into the assembling station 36, the cam roller 134 of the main slide assembly 128, which then moves relative to the vacuum plate 108, operates the pusher-shear mechanisms 42. The pusher-shear mechanisms 42 then cut the support rails 30 of the lead strips 28, thereby severing the leading sets of leads 22 in the assembling station 36 from the lead strips 28, and assemble the severed leads to the substrate 26.

As the main slide assembly 128 reaches the end of its advanced movement, it closes the limit switch 150. Then, after a predetermined time delay TD2 (FIG. 16), the controller 230 energizes a solenoid valve 242 to operate the air cylinder 198, which retracts the lead alignment retaining mechanism 44 to its "up" position, thereby disengaging the clamping bars 182 from the assembled leads 22 on the substrate 26. At the same time the controller 230 energizes a solenoid valve 244 to operate the clamp cylinders 76 of the movable lead strip clamping mechanism 68 to their advanced "in" position to clamp the lead strips 28 for a lead strip feeding operation.

Upon the expiration of another predetermined time delay TD3 (FIG. 16), the controller 230 de-energizes the solenoid valve 240 to retract the dual slide mechanism cylinder 136, thereby opening the limit switch 150. At the same time the controller 230 energizes a solenoid valve 246 to retract the clamp cylinders 76 of the fixed lead strip clamping mechanism 74, to disengage its clamping pins 78 from the lead strips 28 and to permit feeding of the lead strips 28 through the clamping mechanism.

The initial retraction movement of the dual slide mechanism 110 disengages the cam roller 134 from the actuating arms 166 of the pusher-shear mechanisms 42, to permit retraction thereof by their respective return springs 176, thus disengaging the pusher slides 158 from the assembled leads 22 on the substrate 26. Subsequently, the vacuum plate 108 of the dual slide mechanism 110 also is retracted to remove the lead-substrate circuit assembly 20A (FIG. 14) from the lead-substrate assembling station 36. During this movement the circuit assembly 20A is stripped from the vacuum plate 108 by engagement with the escapement bar 96 on the substrate feed table 98, and the circuit assembly drops onto the discharge shelf 215. As the dual slide mechanism 110 reaches its retracted position, the actuator screw 216 on the secondary slide block 122 recloses the limit switch 217.

Upon the expiration of another predetermined time delay TD4 (FIG. 16) and closure of the limit switch 217, the controller 230 energizes a solenoid valve 248 to operate the air cylinder 66, which advances the lead strip feed mechanism 34 to feed a new leading set of leads 22 into the lead-substrate assembling station 36. As the lead strip feed mechanism 34 reaches its advanced position it closes the limit switch 87.

After a predetermined time delay TD5 (FIG. 16) measured from the closing of the limit switch 87, the controller 230 de-energizes the solenoid valve 242 to operate the air cylinder 198 downward, thus permitting the biased clamping bars 182 of the lead alignment retaining mechanism 44 to be moved downward into clamping engagement with the new leading sets of leads 22 in the lead-substrate assembling station 36. At the same time the controller 230 de-energizes the solenoid valve 246 to advance the cylinders 76 and the clamping pins 78 of the fixed lead strip clamping mechanism 74 into clamping engagement with the lead strips 28.

Upon the expiration of another predetermined time delay TD6 (FIG. 16), the controller 230 de-energizes the solenoid valve 244 to retract the clamp cylinders 76 and the clamping pins 78 of the movable lead strip clamping mechanism 74 from the lead strips 28. Then, upon expiration of a time delay TD7 (FIG. 16), the controller de-energizes the solenoid valve 248 to retract the air cylinder 66 and the lead strip feed mechanism 34, thus opening the limit switch 87 and restoring the apparatus to its initial start condition. The above-described cycle of operation then is repeated.

INDUSTRIAL APPLICATION

In summary, a system has been disclosed for rapidly and efficiently assembling leads 22 (FIG. 1) to a substrate 26 wherein the leads initially project in parallel relationship from a continuous independent support member, such as the rail 30. This is accomplished by simultaneously feeding a pair of the independent support rails 30 by means of the one-way feed mechanism 34 (FIGS. 4B and 5B), to locate successive sets of the leads 22 on opposite sides of the lead-substrate assembling station 36, as shown in FIGS. 8 and 12. At the same time the substrates 26 are automatically fed one at a time from the dual track magazine 38 into the lead-substrate assembling station 36, by the substrate feeding mechanism 40 (FIGS. 4A and 5A), including the dual slide mechanism 110 (best shown in FIGS. 5A and 7).

With the leading sets of leads 22 on the support rails 30 located in the lead-substrate assembling station 36, the leads are clamped to the pusher-shear mechanisms 42 by the lead alignment retaining mechanism 44 as shown in FIG. 13. The pusher-shear mechanisms 42 then are advanced toward one another in response to advancement of the dual slide mechanism 110 as shown in FIG. 7, to cut the support rails 30 of the lead strips 28, thereby severing the leading sets of the leads 22 from the remaining leads on the support rails, and to assemble the severed sets of leads 22 to the substrate 26 as is shown in FIG. 14. During the assembling operation, the lead alignment retaining mechanism 44 precludes shifting of the severed sets of leads relative to the terminals 24 (FIGS. 1 and 2) on the substrate 26, to insure assembly of the leads to the terminals in proper alignment therewith.

The lead alignment retaining mechanism 44 then is disengaged from the lead-substrate assembly 22, 26 and returned to its "up" position as shown in FIG. 12. Next, the dual slide mechanism 110 is returned from its advanced position as shown in FIG. 7, to its retracted position as shown in FIG. 5A. During the initial portion of this movement the pusher-shear mechanisms 42 also are disengaged from the lead-substrate assembly 20A (FIGS. 2 and 14) and returned to their initial positions as shown in FIG. 12.

During the final portion of the retraction of the dual slide mechanism 110, the vacuum plate 108 thereof is retracted to move the lead-substrate circuit assembly 20A (FIGS. 2 and 14) therewith out of the lead-substrate assembling station 36. Referring to FIG. 4A, during this movement the lead-substrate circuit assembly 20A is stripped from the vacuum plate 108 by the escapement bar 96 on the substrate feed table 98, drops onto the discharge shelf 215, is pushed into the chute 218 (which is inclined in operation as above described), and slides down the chute to a position from which it is manually transferred to the carrying tray 226 at the upper left of FIG. 4A. Subsequently, the lead-substrate circuit assembly 20A is subjected to additional processing, including wave soldering of the leads 22 to the terminals 24 on the substrate 26, and clipping of the support rails 30 from the soldered leads, to form the finished substrate circuit device 20D as shown in FIG. 3.

What is claimed is:

1. A method of assembling leads to a substrate wherein the leads project in spaced parallel relationship from a continuous support rail, which comprises:
   supporting the substrate in a lead-substrate assembling position;
   simultaneously feeding a pair of independent support rails along essentially parallel paths to locate leads on the support rails on opposite sides of the lead-substrate assembling position;
   engaging outer portions of the leads in the lead-substrate assembling position and moving the leads in opposite directions toward a substrate in the lead-substrate assembling position to assemble the leads to respective opposite sides of the substrate simultaneously;

engaging inner portions of the leads in the lead-substrate assembling position simultaneously with the engaging of the outer portions of the leads, to retain terminal-engaging portions of the leads in alignment with respective terminals on the substrate as the leads are assembled to the substrate; and cutting the support rails to sever the leads in the lead-substrate assembling position from the remaining leads on the support rails.

2. The method as recited in claim 1, in which:

the support rails are cut simultaneously as the leads in the lead-substrate assembling position are assembled to the substrate.

3. Apparatus for assembling leads to a substrate wherein the leads project in parallel relationship from respective independent support members, which comprises:

means for supporting the substrate in a lead-substrate assembling position;

first and second lead-engaging means engageable with outer portions of respective ones of the leads for moving the leads toward the substrate in the lead-substrate assembling position to assemble the leads to respective opposite sides of the substrate simultaneously;

first moving means for moving the first and second lead-engaging means from retracted positions into advanced positions in which the first and second lead-engaging means assemble the leads to the substrate in the lead-substrate assembling position;

first and second lead-alignment retaining means engageable with inner portions of respective ones of the leads to clamp the leads to the first and second lead-engaging means, respectively, for retaining terminal-engaging portions of the leads in alignment with respective terminals on the substrate in the lead-substrate assembling position as the first and second lead-engaging means assemble the leads to the substrate;

second moving means for moving the first and second lead-alignment retaining means from retracted positions into advanced positions in which the lead-alignment retaining means engage the inner portions of respective ones of the leads, the second moving means including means for urging the first and second lead-alignment retaining means into engagement with the inner portions of the leads and permitting inward movement of the lead-alignment retaining means in response to movement of the leads by the first and second lead-engaging means into assembled relationship with the substrate in the lead-substrate assembling position; and first and second return means for returning the first and second lead-engaging means, and the first and second lead-alignment retaining means, respectively, to their retracted positions.

4. Apparatus as recited in claim 3, in which the first moving means includes:

camming means for operating the first and second lead-engaging means simultaneously.

5. Apparatus as recited in claim 3, in which each of the first and second lead-alignment retaining means includes:

an elongated lead clamping member engageable with inner portions of respective ones of the leads to clamp the leads to a respective one of the first and second lead-engaging means.

6. Apparatus as recited in claim 5, in which the urging means of the second moving means includes:

first means for urging the elongated lead clamping members into engagement with inner portions of their respective leads in a first direction; and separate second means for urging the elongated lead clamping members into engagement with inner portions of their respective leads in a second direction essentially perpendicular to the first direction.

7. Apparatus as recited in claim 6, which further comprises:

a movable support means on which the elongated clamping members are mounted for movement relative to the support means, the support means being movable by the second moving means to move the clamping members adjacent to the leads prior to assembly of the leads to the substrate by the first and second lead-engaging means, and being movable away from the leads by the second return means after assembly of the leads to the substrate by the first and second lead engaging means, with at least one of the clamping member urging means also being mounted on the movable support means.

8. Apparatus as recited in claim 3, which further comprises:

a movable support frame; and sets of spaced interconnected arms pivotally mounted on the movable support frame, the first and second lead-alignment retaining means being mounted on respective ones of the sets of arms;

the urging means for the first and second lead-alignment retaining means including first resilient means for moving the support frame in one direction to locate the first and second lead-alignment retaining means adjacent respective ones of the leads prior to assembly of the leads to the substrate by the first and second lead-engaging means;

the urging means for the first and second lead-alignment retaining means further including second resilient means for simultaneously pivoting the sets of arms in respective first directions to urge the first and second lead-alignment retaining means outward into engagement with the inner portions of the leads during assembly of the leads to the substrate, the second resilient means being mounted on the support frame and permitting pivotable movement of the sets of arms in reverse directions as the leads are assembled to the substrate by the first and second lead-engaging means; and the second return means moving the support frame in a reverse direction against the action of the first resilient means after the leads have been assembled to the substrate by the first and second lead-engaging means.

9. Apparatus as recited in claim 8, in which:

the support frame is mounted for limited universal movement.

10. Apparatus for assembling leads to a substrate wherein the leads project in parallel relationship from a continuous support rail, which comprises:

means for supporting the substrate in a lead-substrate assembling position;

feed means for feeding a pair of independent support rails to locate leads on the support rails on opposite sides of the lead-substrate assembling position;

first and second pusher means engageable with outer portions of the leads in the lead-substrate assembling position for moving the leads toward the substrate in the lead-substrate assembling position to assemble the leads to respective opposite sides of the substrate simultaneously;

first moving means for moving the first and second pusher means from retracted positions into advanced positions in which the pusher means assemble the leads to the substrate in the lead-substrate assembling position;

first and second lead-alignment retaining means engageable with inner portions of respective ones of the leads in the lead-substrate assembling position, for clamping the leads to the first and second pusher means to retain terminal-engaging portions of the leads in alignment with respective terminals on the substrate as the pusher means assemble the leads to the substrate;

second moving means for moving the first and second lead-alignment retaining means from retracted positions into advanced positions in which the lead-alignment retaining means engage the inner portions of respective ones of the leads, the second moving means including means for urging the first and second lead-alignment retaining means into engagement with the inner portions of the leads and permitting inward movement of the lead-alignment retaining means in response to movement of the leads by the pusher means into assembled relationship with the substrate in the lead-substrate assembly position;

first and second cutter means for cutting the support rails to sever the leads in the lead-substrate assembling position from the remaining leads on the support rails; and first and second return means for returning the first and second pusher means, and the first and second lead-alignment retaining means, respectively, to their retracted positions.

11. Apparatus as recited in claim 10, in which:

a portion of each support rail cutter means is mounted on a respective one of the first and second pusher means.

12. Apparatus as recited in claim 10, in which each of the first and second pusher means includes:

a reciprocable slide movable toward and away from the lead-substrate assembling position and having a seat portion for receiving the leads fed into the lead-substrate assembling position;

a pivotally mounted actuating arm having an outer free end portion disposed adjacent an outer free end portion of a pivotally mounted actuating arm of the other pusher means; and means interconnecting the reciprocable slide and the actuating arm for reciprocating the slide upon pivoting of the actuating arm.

13. Apparatus as recited in claim 12, in which the first moving means includes:

camming means for engaging the outer free end portions of the actuating arms of the first and second pusher means to pivot the arms and to move the reciprocable slides to assemble the leads in the lead-substrate assembling position to the substrate simultaneously under uniform speed and pressure.

14. Apparatus as recited in claim 13, which further comprises:

vacuum plate means for holding the substrate;

a dual slide mechanism including a first slide assembly mounted on a second slide assembly for movement relative to the second slide assembly, the vacuum plate means forming part of the first slide assembly and the camming means forming part of the second slide assembly;

means for moving the dual slide mechanism such that the vacuum plate means feeds the substrate into the lead-substrate assembling position;

means for causing the first and second slide assemblies of the dual slide mechanism to move in unison during feeding of the substrate into the lead-substrate assembling position by the vacuum plate means of the first slide assembly; and means for interrupting movement of the substrate and the first slide assembly by the moving means to locate the substrate in the lead-substrate assembling position, whereupon the moving means continues to move the second slide assembly relative to the first slide assembly such that the camming means of the second slide assembly pivots the actuator arms of the first and second pusher means to cause assembly of the leads in the lead-substrate assembling position to the substrate.

15. Apparatus as recited in claim 10, in which each of the first and second lead-alignment retaining means includes:

an elongated lead clamping member engageable with respective ones of the leads in the lead-substrate assembling position.

16. Apparatus as recited in claim 15, in which the urging means of the second moving means includes:

first means for urging the elongated lead clamping members into engagement with inner portions of their respective leads in a first direction; and separate second means for urging the elongated lead clamping members into engagement with inner portions of their respective leads in a second direction essentially perpendicular to the first direction.

17. Apparatus as recited in claim 16, which further comprises:

a movable support means on which the elongated clamping members are mounted for movement relative to the support means, the support means being movable by the second means to move the clamping members adjacent to the leads prior to assembly of the leads to the substrate by the first and second pusher means, and being movable away from the leads by the second return means after assembly of the leads to the substrate by the first and second pusher means, with at least one of the clamping member urging means also being mounted on the movable support means.

18. Apparatus as recited in claim 15, which further comprises:

a movable support frame; and sets of spaced interconnected arms pivotally mounted on the movable support frame with the elongated lead clamping members being mounted on respective ones of the sets of arms;

the urging means for the first and second lead-alignment retaining means including first resilient means for moving the support frame in a first linear direction to locate the lead clamping members adjacent the leads in the lead-substrate assembly position prior to assembly of the leads to the substrate by the first and second pusher means;

the urging means for the first and second lead-alignment retaining means further including second resilient means for simultaneously pivoting the sets of arms in respective first directions to urge the elongated lead clamping members into engagement with the inner portions of the leads in the lead-substrate assembling position during assembly of the leads to the substrate, the second resilient means being mounted on the support frame and permitting pivotal movement of the sets of arms in reverse directions as the leads are assembled to the substrate by the first and second pusher means; and the second return means moving the support frame in a reverse linear direction against the action of the first resilient means after the leads in the lead-substrate assembling position have been assembled to the substrate by the first and second pusher means.

19. Apparatus as recited in claim 18, in which:

the movable support frame is mounted for limited universal movement.

* * * * *

UNITED STATES PATENT AND TRADEMARK OFFICE
CERTIFICATE OF CORRECTION

PATENT NO. : 4,177,554

DATED : December 11, 1979

INVENTOR(S) : Ernest E. Deveres-Paul J. Ouellette-Joseph F. Pollitt

It is certified that error appears in the above-identified patent and that said Letters Patent are hereby corrected as shown below:

In the specification, Column 8, line 2, "and" should read --or--. Column 10, line 21, "the" should read --The--. Column 12, line 13, "cylinders" should read --cylinder--; line 59, "continues" should read --continued--. Column 19, line 35, "assembly" should read --assembling--. Column 20, line 48, after "second" insert --moving--; line 68, "assembly" should read --assembling--.

Signed and Sealed this

Twenty-ninth Day of April 1980

[SEAL]

Attest:

SIDNEY A. DIAMOND

Attesting Officer

Commissioner of Patents and Trademarks